United States Patent
Wang et al.

(10) Patent No.: US 12,117,473 B1
(45) Date of Patent: Oct. 15, 2024

(54) METHOD AND SYSTEM FOR MEASURING BROADBAND IMPEDANCE OF RENEWABLE ENERGY POWER GENERATION DEVICE

(71) Applicant: CHINA ELECTRIC POWER RESEARCH INSTITUTE, Beijing (CN)

(72) Inventors: Weisheng Wang, Beijing (CN); Guanghui Li, Beijing (CN); Guoqing He, Beijing (CN); Yuntao Xiao, Beijing (CN); Yu Lei, Beijing (CN); Zixuan Guo, Beijing (CN); Shuanglei Feng, Beijing (CN); Caiyun Gao, Beijing (CN); Junhua Ma, Beijing (CN); Keke Liu, Beijing (CN); Liping Gao, Beijing (CN); Ni Zhen, Beijing (CN); Yuye Li, Beijing (CN); Yuqi Duan, Beijing (CN); Fangfang Yu, Beijing (CN)

(73) Assignee: CHINA ELECTRIC POWER RESEARCH INSTITUTE, Beijing (CN)

( * ) Notice: Subject to any disclaimer, the term of this patent is extended or adjusted under 35 U.S.C. 154(b) by 0 days.

(21) Appl. No.: 18/740,672

(22) Filed: Jun. 12, 2024

(30) Foreign Application Priority Data

Aug. 1, 2023 (CN) .......................... 202310955245.9

(51) Int. Cl.
  *G01R 27/16* (2006.01)
(52) U.S. Cl.
  CPC .................. *G01R 27/16* (2013.01)
(58) Field of Classification Search
  CPC ............................ G01R 27/16; G01N 27/122
  (Continued)

(56) References Cited

U.S. PATENT DOCUMENTS

| | | | |
|---|---|---|---|
| 7,508,224 B2 * | 3/2009 | Williams | G01R 27/32 324/707 |
| 2022/0200579 A1 * | 6/2022 | Qiu | G01R 31/42 |
| 2022/0413026 A1 * | 12/2022 | Davarpanah | G01R 31/086 |

FOREIGN PATENT DOCUMENTS

| CN | 107656143 A | 2/2018 |
|---|---|---|
| CN | 109932568 A | 6/2019 |

(Continued)

OTHER PUBLICATIONS

Li Guanghui et al, "Impedance Measurement and Influence Factors Analysis for Wind Turbines Based on Control-hardware-in-the-loop", Power System Technology vol. 43 No. 5, May 2019, pp. 1624-1631. 8 pages with English.

(Continued)

*Primary Examiner* — Tung X Nguyen
*Assistant Examiner* — Robert P Alejnikov, Jr.
(74) *Attorney, Agent, or Firm* — Cooper Legal Group, LLC

(57) ABSTRACT

A method and system for measuring broadband impedance of a renewable energy power generation device. A voltage disturbance is injected into the renewable energy power generation device by using a disturbance injection device, and three-phase voltage and three-phase current of each of preset measurement points are acquired. Relevant variables before the renewable energy power generation device is decoupled from a measurement device and impedance of a power grid, are calculated according to the three-phase voltage and the three-phase current of each of the preset measurement points. Impedance of the renewable energy power generation device after being decoupled from the measurement device and the impedance of the power grid, is calculated.

20 Claims, 3 Drawing Sheets

(58) Field of Classification Search
USPC .......................................................... 324/707
See application file for complete search history.

(56) References Cited

FOREIGN PATENT DOCUMENTS

| | | | | | |
|---|---|---|---|---|---|
| CN | 108303590 | B | | 8/2019 | |
| CN | 110108946 | A | | 8/2019 | |
| CN | 108918973 | B | | 7/2020 | |
| CN | 112421683 | A | | 2/2021 | |
| CN | 114113792 | A | * | 3/2022 | |
| CN | 114325113 | A | | 4/2022 | |
| CN | 114465269 | A | | 5/2022 | |
| CN | 114564821 | A | | 5/2022 | |
| CN | 114597911 | A | | 6/2022 | |
| CN | 113533857 | B | * | 8/2022 | |
| CN | 114935690 | A | | 8/2022 | |
| CN | 115037054 | A | * | 9/2022 | |
| CN | 218733935 | U | * | 3/2023 | ............. G01R 27/02 |
| CN | 115980453 | A | * | 4/2023 | |
| CN | 116087623 | A | * | 5/2023 | |

OTHER PUBLICATIONS

Wu Wenhua, "Research on Wide-bandwidth Oscillation Mechanism and Suppression Methods of Renewable Energy Power Generation Connected to the Weak Grid", Hunan University, May 2019, the whole document. 158 pages with English abstract.

* cited by examiner

METHOD AND SYSTEM FOR MEASURING BROADBAND IMPEDANCE OF RENEWABLE ENERGY POWER GENERATION DEVICE

CROSS REFERENCE TO RELATED APPLICATIONS

This application is based on and claims priority of Chinese Patent Application No. 202310955245.9, filed on Aug. 1, 2023 and entitled "METHOD AND SYSTEM FOR MEASURING BROADBAND IMPEDANCE OF RENEWABLE ENERGY POWER GENERATION DEVICE", the disclosure of which is incorporated herein by reference in its entirety.

TECHNICAL FIELD

The disclosure relates to the technical field of renewable energy gird-related performance testing, and in particular relates to a method and system for measuring broadband impedance of a renewable energy power generation device.

BACKGROUND

In recent years, an impedance analysis method has become an important method for analyzing and solving a large-scale renewable energy grid-integrated oscillation problem, and impedance measurement has become an important part of gird-related performance testing of a renewable energy grid-integrated device.

At present, impedance measurement methods mainly include an impedance measurement method based on control hardware in the loop (CHIL) and an impedance measurement method based on on-site measurement by a disturbance injection device. For the impedance measurement method based on control hardware in the loop, errors will occur in a CHIL measurement result since factors such as CHIL delay, simulation step and so on cannot be ignored; nonlinear factors such as temperature rise of semiconductors, inductors and capacitors and so on are difficult to take into account; difference in parameters of a wind turbine unit on site is large, or other reasons.

In order to accurately reveal impedance characteristics of a renewable energy power generation device, a method of measuring broadband impedance of renewable energy power generation by the disturbance injection device on site is usually used. In impedance on-site measurement, a voltage disturbance with a specific frequency is injected by the disturbance injection device, voltage and current at a port of the renewable energy power generation device are acquired, and impedance of the renewable energy power generation device at this frequency is obtained, and then a broadband impedance measurement result is obtained by changing the disturbance frequency in sequence. This method solves problems of topology of a measurement device, injection of disturbance voltage, or the like, and uses a voltage to current ratio in a frequency domain as the impedance of the renewable energy power generation device. However, since the measurement device itself has output impedance and presents non-ideal voltage source characteristics, there is a multi-frequency coupling response between voltage and current. The voltage and current are not only affected by the impedance of the renewable energy power generation device, but also by nonlinear coupling between the measurement device and equivalent impedance of a power grid. It may be seen that the impedance calculated based on the voltage to current ratio cannot fully reflect true impedance characteristics of a measured object, resulting in insufficient measurement accuracy.

SUMMARY

According to a first aspect of embodiments of the disclosure, there is provided a method for measuring broadband impedance of a renewable energy power generation device, the renewable energy power generation device is connected to three-phase transmission lines of a power grid through primary sides of three coupling transformers respectively; one end of a secondary side of each of the three coupling transformers is connected to a respective output of a disturbance injection device in the measurement device, and another end of the secondary side of each of the three coupling transformers is connected to one another.

The method for measuring broadband impedance of the renewable energy power generation device includes the following operations.

A voltage disturbance is injected into the renewable energy power generation device by using the disturbance injection device, and three-phase voltage and three-phase current of each of preset measurement points are acquired.

Relevant variables before the renewable energy power generation device is decoupled from the measurement device and impedance of the power grid, are calculated according to the three-phase voltage and the three-phase current of each of the preset measurement points.

Impedance of the renewable energy power generation device after being decoupled from the measurement device and the power grid impedance, is calculated by using the relevant variables before the renewable energy power generation device is decoupled from the measurement device and the impedance of the power grid.

According to a second aspect of the embodiments of the disclosure, a system for measuring broadband impedance of a renewable energy power generation device is provided, the renewable energy power generation device is connected to three-phase transmission lines of a power grid through primary sides of three coupling transformers in a measurement device respectively; one end of a secondary side of each of the three coupling transformers in the measurement device is connected to a respective output of a disturbance injection device in the measurement device, and another end of the secondary side of each of the three coupling transformers is connected to one another.

The system for measuring broadband impedance of the renewable energy power generation device includes an injection unit, a first calculation unit, and a second calculation unit.

The injection unit is configured to inject, by using the disturbance injection device, a voltage disturbance into the renewable energy power generation device, and acquire three-phase voltage and three-phase current of each of preset measurement points.

The first calculation unit is configured to calculate relevant variables before the renewable energy power generation device is decoupled from the measurement device and impedance of the power grid, according to the three-phase voltage and the three-phase current of each of the preset measurement points.

The second calculation unit is configured to calculate impedance of the renewable energy power generation device after being decoupled from the measurement device and the impedance of the power grid, by using the relevant variables before the renewable energy power generation device is decoupled from the measurement device and the impedance of the power grid.

According to a third aspect of the embodiments of the disclosure, there is provided a computer device, the computer device includes one or more processors.

The processor is configured to store one or more programs.

The one or more programs implement the above method for measuring broadband impedance of the renewable energy power generation device, when the one or more programs are executed by the one or more processors.

According to a fourth aspect of the embodiments of the disclosure, there is provided a computer-readable storage medium, having stored thereon a computer program. The computer program implements the above method for measuring broadband impedance of the renewable energy power generation device, when the computer program is executed.

BRIEF DESCRIPTION OF THE DRAWINGS

In order to explain the embodiments of the disclosure or technical solutions in the related art more clearly, drawings required to be used in descriptions of the embodiments or the related art will be briefly introduced below. It is apparent that the drawings described below are only some embodiments of the disclosure. Other drawings may also be obtained by those of ordinary skill in the art according to these drawings, without paying any creative work.

Figure 1:
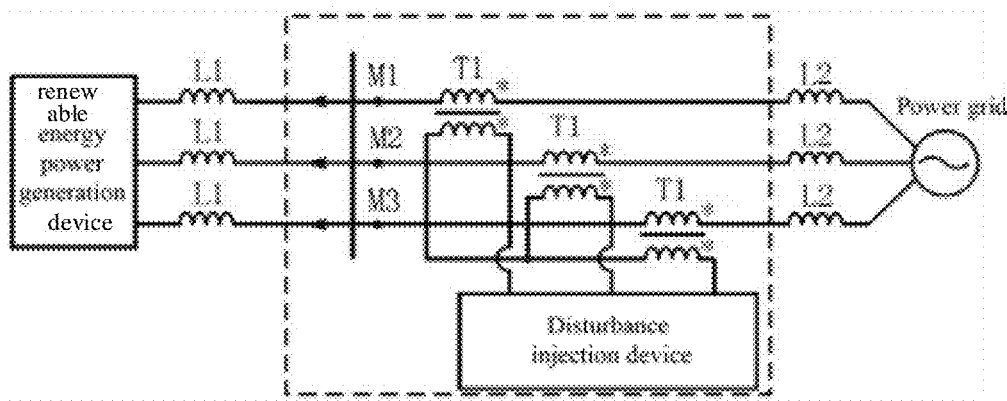
FIG. 1 is a schematic diagram of a topological structure involved in a method for measuring broadband impedance of a renewable energy power generation device provided in an embodiment of the disclosure.

In the figures, L1 is a first inductor, L2 is a second inductor, T1 is a coupling transformer, M1 is a first measurement point, M2 is a second measurement point, and M3 is a third measurement point.

DETAILED DESCRIPTION

In order to make the purpose, technical solutions and advantages of the embodiments of the disclosure clearer, the technical solutions of the embodiments of the disclosure will be clearly and completely described below with reference to the drawings in the embodiments of the disclosure. It is apparent that the described embodiments are only part of the embodiments of the disclosure, rather than all of the embodiments. Based on the embodiments of the disclosure, all other embodiments obtained by those of ordinary skill in the art without paying any creative work fall within the scope of protection of the disclosure.

In order to at least overcome problems existed in the related art to a certain extent, the disclosure provides a method and system for measuring broadband impedance of a renewable energy power generation device.

According to a first aspect of embodiments of the disclosure, there is provided a method for measuring broadband impedance of a renewable energy power generation device, the renewable energy power generation device is connected to three-phase transmission lines of a power grid through primary sides of three coupling transformers in a measurement device respectively; one end of a secondary side of each of the three coupling transformers in the measurement device is connected to a respective output of a disturbance injection device in the measurement device, and another end of the secondary side of each of the three coupling transformers is connected to one another.

The method for measuring broadband impedance of the renewable energy power generation device includes the following operations.

A voltage disturbance is injected into the renewable energy power generation device by using the disturbance injection device, and three-phase voltage and three-phase current of each of preset measurement points are acquired.

Relevant variables before the renewable energy power generation device is decoupled from the measurement device and impedance of the power grid, are calculated according to the three-phase voltage and the three-phase current of each of the preset measurement points.

Impedance of the renewable energy power generation device after being decoupled from the measurement device and the impedance of the power grid, is calculated by using the relevant variables before the renewable energy power generation device is decoupled from the measurement device and the impedance of the power grid.

In an embodiment, a first inductor may be arranged on each phase of the three-phase transmission lines between the renewable energy power generation device and a respective one of the coupling transformers, and a second inductor may be arranged on each phase of the three-phase transmission lines between a respective one of the coupling transformers and the power grid.

Each of the preset measurement points is selected from a respective phase of the three-phase transmission lines between a respective one of the coupling transformers and the first inductor.

In an embodiment, the operation of injecting the voltage disturbance into the renewable energy power generation device by using the disturbance injection device, and acquiring the three-phase voltage and the three-phase current of each of the preset measurement points may include the following operations.

In a preset measurement period $T_m$, at each of preset operation points of the renewable energy power generation device, a positive-sequence voltage disturbance at each first preset frequency is injected into the renewable energy power generation device by using the disturbance injection device, and a first three-phase voltage and a first three-phase current of each of the preset measurement points are acquired, until a continuous injection time of the positive-sequence voltage disturbance reaches $T_d$, at which injection of the positive-sequence voltage disturbance is stopped.

In the preset measurement period $T_m$, at each of the preset operation points of the renewable energy power generation device, a negative-sequence voltage disturbance at each second preset frequency is injected into the renewable energy power generation device by using the disturbance injection device, and a second three-phase voltage and a second three-phase current of each of the preset measurement points are acquired, until a continuous injection time of the negative-sequence voltage disturbance reaches $T_d$, at which injection of the negative-sequence voltage disturbance is stopped, here $T_d<(T_m/2)$.

In an embodiment, the first preset frequency and the second preset frequency may meet a formula:

$$f_{pp}=f_p-2f_1$$

here $f_p$ is the first preset frequency, $f_{pp}$ is the second preset frequency, and $f_1$ is a rated frequency of the power grid.

In an embodiment, the operation of calculating the relevant variables before the renewable energy power generation device is decoupled from the measurement device and the impedance of the power grid, according to the three-phase voltage and the three-phase current of each of the preset measurement points may include the following operations.

Fourier transform is performed on the three-phase voltage and the three-phase current of each of the preset measurement points, to obtain frequency domain signals.

The relevant variables before the renewable energy power generation device is decoupled from the measurement device and the impedance of the power grid, are calculated by using the frequency domain signals.

In an embodiment, the frequency domain signals may include: a first disturbance voltage positive-sequence frequency domain signal, a first disturbance voltage negative-sequence frequency domain signal, a first disturbance current positive-sequence frequency domain signal, a first disturbance current negative-sequence frequency domain signal, a second disturbance voltage positive-sequence frequency domain signal, a second disturbance voltage negative-sequence frequency domain signal, a second disturbance current positive-sequence frequency domain signal, and a second disturbance current negative-sequence frequency domain signal.

The relevant variables before the renewable energy power generation device is decoupled from the measurement device and the impedance of the power grid may include: an equivalent negative-sequence admittance of coupling the measurement device to the power grid, an equivalent positive-sequence admittance of coupling the measurement device to the power grid, a positive-sequence admittance before the renewable energy power generation device is decoupled from the measurement device, a negative-sequence admittance before the renewable energy power generation device is decoupled from the measurement device, a ratio of a negative-sequence voltage to a positive-sequence voltage when a positive-sequence voltage disturbance is injected, and a ratio of a negative-sequence voltage to a positive-sequence voltage when a negative-sequence voltage disturbance is injected.

In an embodiment, the operation of performing the Fourier transform on the three-phase voltage and the three-phase current of each of the preset measurement points, to obtain the frequency domain signals may include the following operations.

Fourier transform is performed on a first three-phase voltage of each of the preset measurement points at a first preset frequency, to obtain the first disturbance voltage positive-sequence frequency domain signal; Fourier transform is performed on the first three-phase voltage of each of the preset measurement points at a second preset frequency, to obtain the first disturbance voltage negative-sequence frequency domain signal; Fourier transform is performed on a first three-phase current of each of the preset measurement points at the first preset frequency, to obtain the first disturbance current positive-sequence frequency domain signal; Fourier transform is performed on the first three-phase current of each of the preset measurement points at the second preset frequency, to obtain the first disturbance current negative-sequence frequency domain signal.

Fourier transform is performed on a second three-phase voltage of each of the preset measurement points at the first preset frequency, to obtain the second disturbance voltage positive-sequence frequency domain signal; Fourier transform is performed on the second three-phase voltage of each of the preset measurement points at the second preset frequency, to obtain the second disturbance voltage negative-sequence frequency domain signal; Fourier transform is performed on a second three-phase current of each of the preset measurement points at the first preset frequency, to obtain the second disturbance current positive-sequence frequency domain signal; Fourier transform is performed on the second three-phase current of each of the preset measurement points at the second preset frequency, to obtain the second disturbance current negative-sequence frequency domain signal.

In an embodiment, the equivalent negative-sequence admittance of coupling the measurement device to the power grid may be calculated by using a formula:

$$Y_{eq1}=-i_{n1}/v_{n1}$$

here $Y_{eq1}$ is the equivalent negative-sequence admittance of coupling the measurement device to the power grid, $i_{n1}$ is the first disturbance current negative-sequence frequency domain signal, and $v_{n1}$ is the first disturbance voltage negative-sequence frequency domain signal.

The equivalent positive-sequence admittance of coupling the measurement device to the power grid may be calculated by using a formula:

$$Y_{eq2}=-i_{p2}/v_{p2}$$

here $Y_{eq2}$ is the equivalent positive-sequence admittance of coupling the measurement device to the power grid, $i_{p2}$ is the second disturbance current positive-sequence frequency domain signal, and $v_{p2}$ is the second disturbance voltage positive-sequence frequency domain signal.

The positive-sequence admittance before the renewable energy power generation device is decoupled from the measurement device may be calculated by using a formula:

$$Y_p=i_{p1}/v_{p1}$$

here $Y_p$ is the positive-sequence admittance before the renewable energy power generation device is decoupled from the measurement device, $i_{p1}$ is the first disturbance current positive-sequence frequency domain signal, and $v_{p1}$ is the first disturbance voltage positive-sequence frequency domain signal.

The negative-sequence admittance before the renewable energy power generation device is decoupled from the measurement device may be calculated by using a formula:

$$Y_n=i_{n2}/v_{n2}$$

here $Y_n$ is the negative-sequence admittance before the renewable energy power generation device is decoupled from the measurement device, $i_{n2}$ is the second disturbance current negative-sequence frequency domain signal, and $v_{n2}$ is the second disturbance voltage negative-sequence frequency domain signal.

The ratio of the negative-sequence voltage to the positive-sequence voltage when the positive-sequence voltage disturbance is injected may be calculated by using a formula:

$$D_p=v_{n1}/v_{p1}$$

here $D_p$ is the ratio of the negative-sequence voltage to the positive-sequence voltage when the positive-sequence voltage disturbance is injected.

The ratio of the negative-sequence voltage to the positive-sequence voltage when the negative-sequence voltage disturbance is injected may be calculated by using a formula:

$$D_n = v_{p2}/v_{n2}$$

here $D_n$ is the ratio of the negative-sequence voltage to the positive-sequence voltage when the negative-sequence voltage disturbance is injected.

In an embodiment, the operation of calculating the impedance of the renewable energy power generation device after being decoupled from the measurement device and the impedance of the power grid, by using the relevant variables before the renewable energy power generation device is decoupled from the measurement device and the impedance of the power grid may include the following operations.

Relevant variables after the renewable energy power generation device is decoupled from the measurement device and the impedance of the power grid, are calculated by using the relevant variables before the renewable energy power generation device is decoupled from the measurement device and the impedance of the power grid.

The impedance of the renewable energy power generation device is calculated by using the relevant variables after the renewable energy power generation device is decoupled from the measurement device and the impedance of the power grid.

In an embodiment, the relevant variables after the renewable energy power generation device is decoupled from the measurement device and the impedance of the power grid may include:

a positive-sequence admittance of the renewable energy power generation device and a connection line, a negative-sequence admittance of the renewable energy power generation device and the connection line, a positive-sequence coupling admittance of the renewable energy power generation device and the connection line, and a negative-sequence coupling admittance of the renewable energy power generation device and the connection line.

In an embodiment, the operation of calculating the relevant variables after the renewable energy power generation device is decoupled from the measurement device and the impedance of the power grid, by using the relevant variables before the renewable energy power generation device is decoupled from the measurement device and the impedance of the power grid may include the following operations.

The positive-sequence admittance of the renewable energy power generation device and the connection line is calculated by using the positive-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent negative-sequence admittance of coupling the measurement device to the power grid.

The negative-sequence admittance of the renewable energy power generation device and the connection line is calculated by using the negative-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent positive-sequence admittance of coupling the measurement device to the power grid.

The negative-sequence coupling admittance of the renewable energy power generation device and the connection line is calculated by using the positive-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent negative-sequence admittance of coupling the measurement device to the power grid.

The positive-sequence coupling admittance of the renewable energy power generation device and the connection line is calculated by using the negative-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent positive-sequence admittance of coupling the measurement device to the power grid.

In an embodiment, the positive-sequence admittance of the renewable energy power generation device and the connection line may be calculated by using a formula:

$$Y_{pp} = \frac{Y_p - D_p D_n Y_{eq1}}{1 - D_p D_n}$$

here $Y_{pp}$ is the positive-sequence admittance of the renewable energy power generation device and the connection line, $Y_p$ is the positive-sequence admittance before the renewable energy power generation device is decoupled from the measurement device, $D_p$ is the ratio of the negative-sequence voltage to the positive-sequence voltage when the positive-sequence voltage disturbance is injected, $D_n$ is the ratio of the negative-sequence voltage to the positive-sequence voltage when the negative-sequence voltage disturbance is injected, and $Y_{eq1}$ is the equivalent negative-sequence admittance of coupling the measurement device to the power grid.

The negative-sequence admittance of the renewable energy power generation device and the connection line may be calculated by using a formula:

$$Y_{nn} = \frac{Y_n - D_p D_n Y_{eq2}}{1 - D_p D_n}$$

here $Y_{nn}$ is the negative-sequence admittance of the renewable energy power generation device and the connection line, $Y_{eq2}$ is the equivalent positive-sequence admittance of coupling the measurement device to the power grid, and $Y_n$ is the negative-sequence admittance before the renewable energy power generation device is decoupled from the measurement device.

The negative-sequence coupling admittance of the renewable energy power generation device and the connection line may be calculated by using a formula:

$$Y_{np} = -D_n\left(\frac{Y_p - D_p D_n Y_{eq1}}{1 - D_p D_n} + Y_{eq1}\right)$$

here $Y_{np}$ is the negative-sequence coupling admittance of the renewable energy power generation device and the connection line.

The positive-sequence coupling admittance of the renewable energy power generation device and the connection line may be calculated by using a formula:

$$Y_{pn} = -D_p \left( \frac{Y_n - D_p D_n Y_{eq2}}{1 - D_p D_n} + Y_{eq2} \right)$$

here $Y_{pn}$ is the positive-sequence coupling admittance of the renewable energy power generation device and the connection line.

In an embodiment, the operation of calculating the impedance of the renewable energy power generation device, by using the relevant variables after the renewable energy power generation device is decoupled from the measurement device and the impedance of the power grid may include the following operations.

The impedance of the renewable energy power generation device is calculated by using the positive-sequence admittance of the renewable energy power generation device and the connection line, the negative-sequence admittance of the renewable energy power generation device and the connection line, the positive-sequence coupling admittance of the renewable energy power generation device and the connection line, and the negative-sequence coupling admittance of the renewable energy power generation device and the connection line.

In an embodiment, the impedance $Z_{RE}$ of the renewable energy power generation device may be calculated by using a formula:

$$Z_{RE} = \begin{bmatrix} Y_{pp} & Y_{np} \\ Y_{pn} & Y_{nn} \end{bmatrix}^{-1} - Z_{line}$$

here $Z_{RE}$ is the impedance of the renewable energy power generation device, $Y_{pp}$ is the positive-sequence admittance of the renewable energy power generation device and the connection line, $Y_{nn}$ is the negative-sequence admittance of the renewable energy power generation device and the connection line, $Y_{np}$ is the negative-sequence coupling admittance of the renewable energy power generation device and the connection line, $Y_{pn}$ is the positive-sequence coupling admittance of the renewable energy power generation device and the connection line, and $Z_{line}$ is impedance of the three-phase transmission lines between the renewable energy power generation device and the coupling transformers.

In an embodiment, the impedance of the three-phase transmission lines between the renewable energy power generation device and the coupling transformers may be calculated by using a formula:

$$Z_{line} = \begin{bmatrix} j2\pi f_p L_{line} & 0 \\ 0 & j2\pi(f_p - 2f_1)L_{line} \end{bmatrix}$$

here $Z_{line}$ is the impedance of the three-phase transmission lines between the renewable energy power generation device and the coupling transformers, j is an imaginary part symbol, $f_p$ is a first preset frequency, $L_{line}$ is an inductance value of each phase of the three-phase transmission lines between the renewable energy power generation device and the coupling transformers, and $f_1$ is a rated frequency of the power grid.

According to a second aspect of the embodiments of the disclosure, there is provided a system for measuring broadband impedance of a renewable energy power generation device, the renewable energy power generation device is connected to three-phase transmission lines of a power grid through primary sides of three coupling transformers in a measurement device respectively; one end of a secondary side of each of the three coupling transformers in the measurement device is connected to a respective output of a disturbance injection device in the measurement device, and another end of the secondary side of each of the three coupling transformers is connected to one another.

The system for measuring broadband impedance of the renewable energy power generation device includes an injection unit, a first calculation unit, and a second calculation unit.

The injection unit is configured to inject, by using the disturbance injection device, a voltage disturbance into the renewable energy power generation device, and acquire three-phase voltage and three-phase current of each of preset measurement points.

The first calculation unit is configured to calculate relevant variables before the renewable energy power generation device is decoupled from the measurement device and impedance of the power grid, according to the three-phase voltage and the three-phase current of each of the preset measurement points.

The second calculation unit is configured to calculate impedance of the renewable energy power generation device after being decoupled from the measurement device and the impedance of the power grid, by using the relevant variables before the renewable energy power generation device is decoupled from the measurement device and the impedance of the power grid.

According to a third aspect of the embodiments of the disclosure, there is provided a computer device, the computer device includes one or more processors.

The processor is configured to store one or more programs.

The one or more programs implement the above method for measuring broadband impedance of the renewable energy power generation device, when the one or more programs are executed by the one or more processors.

According to a fourth aspect of the embodiments of the disclosure, there is provided a computer-readable storage medium, having stored thereon a computer program. The computer program implements the above method for measuring broadband impedance of the renewable energy power generation device, when the computer program is executed.

The disclosure achieves advantageous effects as follows.

The disclosure provides a method and system for measuring broadband impedance of a renewable energy power generation device, the renewable energy power generation device is connected to three-phase transmission lines of a power grid through primary sides of three coupling transformers in a measurement device respectively; one end of a secondary side of each of the three coupling transformers in the measurement device is connected to a respective output of a disturbance injection device in the measurement device, and another end of the secondary side of each of the three coupling transformers is connected to one another. The method for measuring broadband impedance of the renewable energy power generation device includes the following operations. A voltage disturbance is injected into the renewable energy power generation device by using the disturbance injection device, and three-phase voltage and three-phase current of each of preset measurement points are acquired. Relevant variables before the renewable energy power generation device is decoupled from the measurement device and impedance of the power grid, are calculated according to the three-phase voltage and the three-phase current of each of the preset measurement points. Impedance of the renewable energy power generation device after being decoupled from the measurement device and the impedance of the power grid, is calculated by using the relevant variables before the renewable energy power generation device is decoupled from the measurement device and the impedance of the power grid. According to the disclosure, the relevant variables before the renewable energy power generation device is decoupled from the measurement device and the impedance of the power grid, are calculated according to the three-phase voltage and the three-phase current of each of the preset measurement points, and then the impedance of the renewable energy power generation device after being decoupled from the measurement device and the impedance of the power grid, is calculated by using the relevant variables before the renewable energy power generation device is decoupled from the measurement device and the impedance of the power grid, so that influence of nonlinear impedance coupling of the measurement device and the power grid on impedance measurement of the renewable energy power generation device is eliminated, and accuracy and reliability of the impedance measurement are improved.

First Embodiment

The disclosure provides a method for measuring broadband impedance of a renewable energy power generation device. As shown in FIG. 1, a topological structure to which the method is applied includes a renewable energy power generation device, a measurement device, a power grid, first inductors L1 and second inductors L2. The measurement device includes three coupling transformers T1 and a disturbance injection device.

The renewable energy power generation device is connected to three-phase transmission lines of the power grid through primary sides of the three coupling transformers T1 respectively; one end of a secondary side of each of the three coupling transformers T1 is connected to a respective output of the disturbance injection device, and another end of the secondary side of each of the three coupling transformers T1 is connected to one another.

A first inductor L1 is arranged on each phase of the three-phase transmission lines between the renewable energy power generation device and a respective one of the coupling transformers T1, and a second inductor L2 is arranged on each phase of the three-phase transmission lines between a respective one of the coupling transformers T1 and the power grid.

It should be noted that the "disturbance injection device" involved in the embodiments of the disclosure is well known to those skilled in the art, and thus specific implementation thereof will not be described in detail.

Figure 2:
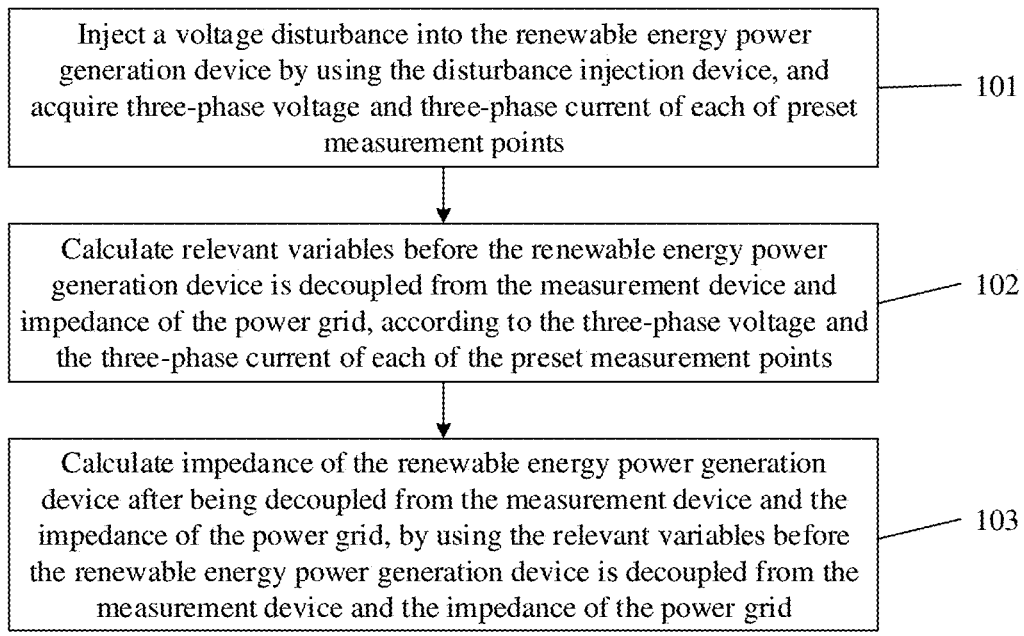
FIG. 2 is a flowchart of a method for measuring broadband impedance of a renewable energy power generation device provided in an embodiment of the disclosure.

As shown in FIG. 2, the method for measuring broadband impedance of the renewable energy power generation device provided in the disclosure includes the following operations 101 to 103.

At 101, a voltage disturbance is injected into the renewable energy power generation device by using the disturbance injection device, and three-phase voltage and three-phase current of each of preset measurement points are acquired.

At 102, relevant variables before the renewable energy power generation device is decoupled from the measurement device and impedance of the power grid, are calculated according to the three-phase voltage and the three-phase current of each of the preset measurement points.

At 103, impedance of the renewable energy power generation device after being decoupled from the measurement device and the impedance of the power grid, is calculated by using the relevant variables before the renewable energy power generation device is decoupled from the measurement device and the impedance of the power grid.

Specifically, as shown in FIG. 1, each of the preset measurement points is selected from a respective phase of the three-phase transmission lines between a respective one of the coupling transformers T1 and the first inductor L1.

The preset measurement points include a first measurement point M1, a second measurement point M2, and a third measurement point M3.

Furthermore, the operation 101 includes the following operations.

In a preset measurement period $T_m$, at each of preset operation points of the renewable energy power generation device, a positive-sequence voltage disturbance at each first preset frequency is injected into the renewable energy power generation device by using the disturbance injection device, and a first three-phase voltage and a first three-phase current of each of the preset measurement points are acquired, until a continuous injection time of the positive-sequence voltage disturbance reaches $T_d$, at which injection of the positive-sequence voltage disturbance is stopped.

In the preset measurement period $T_m$, at each of the preset operation points of the renewable energy power generation device, a negative-sequence voltage disturbance at each second preset frequency is injected into the renewable energy power generation device by using the disturbance injection device, and a second three-phase voltage and a second three-phase current of each of the preset measurement points are acquired, until a continuous injection time of the negative-sequence voltage disturbance reaches $T_d$, at which injection of the negative-sequence voltage disturbance is stopped, here $T_d<(T_m/2)$.

It should be noted that "preset measurement period", "preset operation point", "first preset frequency" and "second preset frequency" are not limited in the embodiments of the disclosure. In some embodiments, they may be set by those skilled in the art according to experimental data or engineering requirements.

In some embodiments, the preset operation points may be, but are not limited to: increasing from zero power to rated power in multiple times. For example, an initial preset operation point is set to be $P_{set}$, powers of the preset operation points increase in sequence, and a difference between the preset operation points is $\Delta P_{set}$, $\Delta P_{set}$ may be, but is not limited to: set by those skilled in the art according to experimental data or engineering requirements.

Furthermore, the first preset frequency and the second preset frequency meet a formula:

$$f_{pp}=f_p-2f_1$$

here $f_p$ is the first preset frequency, $f_{pp}$ is the second preset frequency, and $f_1$ is a rated frequency of the power grid.

In some embodiments, the first preset frequency and the second preset frequency may be, but are not limited to: increasing from 1 Hz to 5000 Hz in multiple times.

Furthermore, the operation 102 includes the following operations 1021 and 1022.

At 1021, Fourier transform is performed on the three-phase voltage and the three-phase current of each of the preset measurement points, to obtain frequency domain signals.

At 1022, the relevant variables before the renewable energy power generation device is decoupled from the measurement device and the impedance of the power grid, are calculated by using the frequency domain signals.

Specifically, the frequency domain signals include: a first disturbance voltage positive-sequence frequency domain signal, a first disturbance voltage negative-sequence frequency domain signal, a first disturbance current positive-sequence frequency domain signal, a first disturbance current negative-sequence frequency domain signal, a second disturbance voltage positive-sequence frequency domain signal, a second disturbance voltage negative-sequence frequency domain signal, a second disturbance current positive-sequence frequency domain signal, and a second disturbance current negative-sequence frequency domain signal.

The relevant variables before the renewable energy power generation device is decoupled from the measurement device and the impedance of the power grid include: an equivalent negative-sequence admittance of coupling the measurement device to the power grid, an equivalent positive-sequence admittance of coupling the measurement device to the power grid, a positive-sequence admittance before the renewable energy power generation device is decoupled from the measurement device, a negative-sequence admittance before the renewable energy power generation device is decoupled from the measurement device, a ratio of a negative-sequence voltage to a positive-sequence voltage when a positive-sequence voltage disturbance is injected, and a ratio of a negative-sequence voltage to a positive-sequence voltage when a negative-sequence voltage disturbance is injected.

Furthermore, the operation 1021 includes the following operations 1021a and 1021b.

At 1021a, Fourier transform is performed on a first three-phase voltage of each of the preset measurement points at a first preset frequency, to obtain the first disturbance voltage positive-sequence frequency domain signal; Fourier transform is performed on the first three-phase voltage of each of the preset measurement points at a second preset frequency, to obtain the first disturbance voltage negative-sequence frequency domain signal; Fourier transform is performed on a first three-phase current of each of the preset measurement points at the first preset frequency, to obtain the first disturbance current positive-sequence frequency domain signal; Fourier transform is performed on the first three-phase current of each of the preset measurement points at the second preset frequency, to obtain the first disturbance current negative-sequence frequency domain signal.

At 1021b, Fourier transform is performed on a second three-phase voltage of each of the preset measurement points at the first preset frequency, to obtain the second disturbance voltage positive-sequence frequency domain signal; Fourier transform is performed on the second three-phase voltage of each of the preset measurement points at the second preset frequency, to obtain the second disturbance voltage negative-sequence frequency domain signal; Fourier transform is performed on a second three-phase current of each of the preset measurement points at the first preset frequency, to obtain the second disturbance current positive-sequence frequency domain signal; Fourier transform is performed on the second three-phase current of each of the preset measurement points at the second preset frequency, to obtain the second disturbance current negative-sequence frequency domain signal.

For example, $v_{a1}$, $v_{b1}$ and $v_{c1}$ are set to be first three-phase voltages of the first measurement point M1, the second measurement point M2 and the third measurement point M3 respectively; $i_{a1}$, $i_{b1}$ and $i_{c1}$ are set to be first three-phase currents of the first measurement point M1, the second measurement point M2 and the third measurement point M3 respectively; $v_{a2}$, $v_{b2}$ and $v_{c2}$ are set to be second three-phase voltages of the first measurement point M1, the second measurement point M2 and the third measurement point M3 respectively; $i_{a2}$, $i_{b2}$ and $i_{c2}$ are set to be second three-phase currents of the first measurement point M1, the second measurement point M2 and the third measurement point M3 respectively.

Fourier transform is performed on $v_{a1}$, $v_{b1}$ and $v_{c1}$ at the first preset frequency, to obtain the first disturbance voltage positive-sequence frequency domain signal; Fourier transform is performed on $v_{a1}$, $v_{b1}$ and $v_{c1}$ at the second preset frequency, to obtain the first disturbance voltage negative-sequence frequency domain signal; Fourier transform is performed on $i_{a1}$, $i_{b1}$ and $i_{c1}$ at the first preset frequency, to obtain the first disturbance current positive-sequence frequency domain signal; Fourier transform is performed on $i_{a1}$, $i_{b1}$ and $i_{c1}$ at the second preset frequency, to obtain the first disturbance current negative-sequence frequency domain signal.

Fourier transform is performed on $v_{a2}$, $v_{b2}$ and $v_{c2}$ at the first preset frequency, to obtain the second disturbance voltage positive-sequence frequency domain signal; Fourier transform is performed on $v_{a2}$, $v_{b2}$ and $v_{c2}$ at the second preset frequency, to obtain the second disturbance voltage negative-sequence frequency domain signal; Fourier transform is performed on $i_{a2}$, $i_{b2}$ and $i_{c2}$ at the first preset frequency, to obtain the second disturbance current positive-sequence frequency domain signal; Fourier transform is performed on $i_{a2}$, $i_{b2}$ and $i_{c2}$ at the second preset frequency, to obtain the second disturbance current negative-sequence frequency domain signal.

Furthermore, the equivalent negative-sequence admittance of coupling the measurement device to the power grid is calculated by using a formula:

$$Y_{eq1} = -i_{n1}/v_{n1}$$

here $Y_{eq1}$ is the equivalent negative-sequence admittance of coupling the measurement device to the power grid, $i_{n1}$ is the first disturbance current negative-sequence frequency domain signal, and $v_{n1}$ is the first disturbance voltage negative-sequence frequency domain signal.

The equivalent positive-sequence admittance of coupling the measurement device to the power grid is calculated by using a formula:

$$Y_{eq2} = -i_{p2}/v_{p2}$$

here $Y_{eq2}$ is the equivalent positive-sequence admittance of coupling the measurement device to the power grid, $i_{p2}$ is the second disturbance current positive-sequence frequency domain signal, and $v_{p2}$ is the second disturbance voltage positive-sequence frequency domain signal.

The positive-sequence admittance before the renewable energy power generation device is decoupled from the measurement device is calculated by using a formula:

$$Y_p = i_{p1}/v_{p1}$$

here $Y_p$ is the positive-sequence admittance before the renewable energy power generation device is decoupled from the measurement device, $i_{p1}$ is the first disturbance current positive-sequence frequency domain signal, and $v_{p1}$ is the first disturbance voltage positive-sequence frequency domain signal.

The negative-sequence admittance before the renewable energy power generation device is decoupled from the measurement device is calculated by using a formula:

$$Y_n = i_{n2}/v_{n2}$$

here $Y_n$ is the negative-sequence admittance before the renewable energy power generation device is decoupled from the measurement device, $i_{n2}$ is the second disturbance current negative-sequence frequency domain signal, and $v_{n2}$ is the second disturbance voltage negative-sequence frequency domain signal.

The ratio of the negative-sequence voltage to the positive-sequence voltage when the positive-sequence voltage disturbance is injected is calculated by using a formula:

$$D_p = v_{n1}/v_{p1}$$

here $D_p$ is the ratio of the negative-sequence voltage to the positive-sequence voltage when the positive-sequence voltage disturbance is injected.

The ratio of the negative-sequence voltage to the positive-sequence voltage when the negative-sequence voltage disturbance is injected is calculated by using a formula:

$$D_n = v_{p2}/v_{n2}$$

here $D_n$ is the ratio of the negative-sequence voltage to the positive-sequence voltage when the negative-sequence voltage disturbance is injected.

Furthermore, the operation 103 includes the following operations 1031 and 1032.

At 1031, relevant variables after the renewable energy power generation device is decoupled from the measurement device and the impedance of the power grid, are calculated by using the relevant variables before the renewable energy power generation device is decoupled from the measurement device and the impedance of the power grid.

At 1032, the impedance of the renewable energy power generation device is calculated by using the relevant variables after the renewable energy power generation device is decoupled from the measurement device and the impedance of the power grid.

The relevant variables after the renewable energy power generation device is decoupled from the measurement device and the impedance of the power grid include:

a positive-sequence admittance of the renewable energy power generation device and a connection line, a negative-sequence admittance of the renewable energy power generation device and the connection line, a positive-sequence coupling admittance of the renewable energy power generation device and the connection line, and a negative-sequence coupling admittance of the renewable energy power generation device and the connection line.

It should be noted that the connection line refers to the three-phase transmission lines between the renewable energy power generation device and the measurement device, that is, the three-phase transmission lines between the renewable energy power generation device and the coupling transformers.

Furthermore, the operation 1031 includes the following operations 1031a to 1031d.

At 1031a, the positive-sequence admittance of the renewable energy power generation device and the connection line is calculated by using the positive-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent negative-sequence admittance of coupling the measurement device to the power grid.

At 1031b, the negative-sequence admittance of the renewable energy power generation device and the connection line is calculated by using the negative-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent positive-sequence admittance of coupling the measurement device to the power grid.

At 1031c, the negative-sequence coupling admittance of the renewable energy power generation device and the connection line is calculated by using the positive-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent negative-sequence admittance of coupling the measurement device to the power grid.

At 1031d, the positive-sequence coupling admittance of the renewable energy power generation device and the connection line is calculated by using the negative-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent positive-sequence admittance of coupling the measurement device to the power grid.

Specifically, the positive-sequence admittance of the renewable energy power generation device and the connection line is calculated by using a formula:

$$Y_{pp} = \frac{Y_p - D_p D_n Y_{eq1}}{1 - D_p D_n}$$

here $Y_{pp}$ is the positive-sequence admittance of the renewable energy power generation device and the connection line, $Y_p$ is the positive-sequence admittance before the renewable energy power generation device is decoupled from the measurement device, $D_p$ is the ratio of the negative-sequence voltage to the positive-sequence voltage when the positive-sequence voltage disturbance is injected, $D_n$ is the ratio of the negative-sequence voltage to the positive-sequence voltage when the negative-sequence voltage disturbance is injected, and $Y_{eq1}$ is the equivalent negative-sequence admittance of coupling the measurement device to the power grid.

The negative-sequence admittance of the renewable energy power generation device and the connection line is calculated by using a formula:

$$Y_{nn} = \frac{Y_n - D_p D_n Y_{eq2}}{1 - D_p D_n}$$

here $Y_{nn}$ is the negative-sequence admittance of the renewable energy power generation device and the connection line, $Y_{eq2}$ is the equivalent positive-sequence admittance of coupling the measurement device to the power grid, and $Y_n$ is the negative-sequence admittance before the renewable energy power generation device is decoupled from the measurement device.

The negative-sequence coupling admittance of the renewable energy power generation device and the connection line is calculated by using a formula:

$$Y_{np} = -D_n \left( \frac{Y_p - D_p D_n Y_{eq1}}{1 - D_p D_n} + Y_{eq1} \right)$$

here $Y_{np}$ is the negative-sequence coupling admittance of the renewable energy power generation device and the connection line.

The positive-sequence coupling admittance of the renewable energy power generation device and the connection line is calculated by using a formula:

$$Y_{pn} = -D_n \left( \frac{Y_n - D_p D_n Y_{eq2}}{1 - D_p D_n} + Y_{eq2} \right)$$

here $Y_{pn}$ is the positive-sequence coupling admittance of the renewable energy power generation device and the connection line.

Furthermore, the operation 1032 includes the following operations.

The impedance of the renewable energy power generation device is calculated by using the positive-sequence admittance of the renewable energy power generation device and the connection line, the negative-sequence admittance of the renewable energy power generation device and the connection line, the positive-sequence coupling admittance of the renewable energy power generation device and the connection line, and the negative-sequence coupling admittance of the renewable energy power generation device and the connection line.

Furthermore, the impedance $Z_{RE}$ of the renewable energy power generation device is calculated by using a formula:

$$Z_{RE} = \begin{bmatrix} Y_{pp} & Y_{np} \\ Y_{pn} & Y_{nn} \end{bmatrix}^{-1} - Z_{line}$$

here $Z_{RE}$ is the impedance of the renewable energy power generation device, $Y_{pp}$ is the positive-sequence admittance of the renewable energy power generation device and the connection line, $Y_{nn}$ is the negative-sequence admittance of the renewable energy power generation device and the connection line, $Y_{np}$ is the negative-sequence coupling admittance of the renewable energy power generation device and the connection line, $Y_{pn}$ is the positive-sequence coupling admittance of the renewable energy power generation device and the connection line, and $Z_{line}$ is impedance of the three-phase transmission lines between the renewable energy power generation device and the coupling transformers T1.

Specifically, the impedance of the three-phase transmission lines between the renewable energy power generation device and the coupling transformers T1 is calculated by using a formula:

$$Z_{line} = \begin{bmatrix} j2\pi f_p L_{line} & 0 \\ 0 & j2\pi(f_p - 2f_1)L_{line} \end{bmatrix}$$

here $Z_{line}$ is the impedance of the three-phase transmission lines between the renewable energy power generation device and the coupling transformers T1, j is an imaginary part symbol, $f_p$ is a first preset frequency, $L_{line}$ is an inductance value of the three-phase transmission lines between the renewable energy power generation device and the coupling transformers T1, and $f_1$ is a rated frequency of the power grid.

Second Embodiment

Measurement of the impedance of the renewable energy power generation device under influence of the impedance of the power grid and the measurement device of the topological structure shown in FIG. 1 at each operation point and each frequency point may also be achieved by using the method for measuring broadband impedance of the renewable energy power generation device according to the disclosure.

Figure 3:
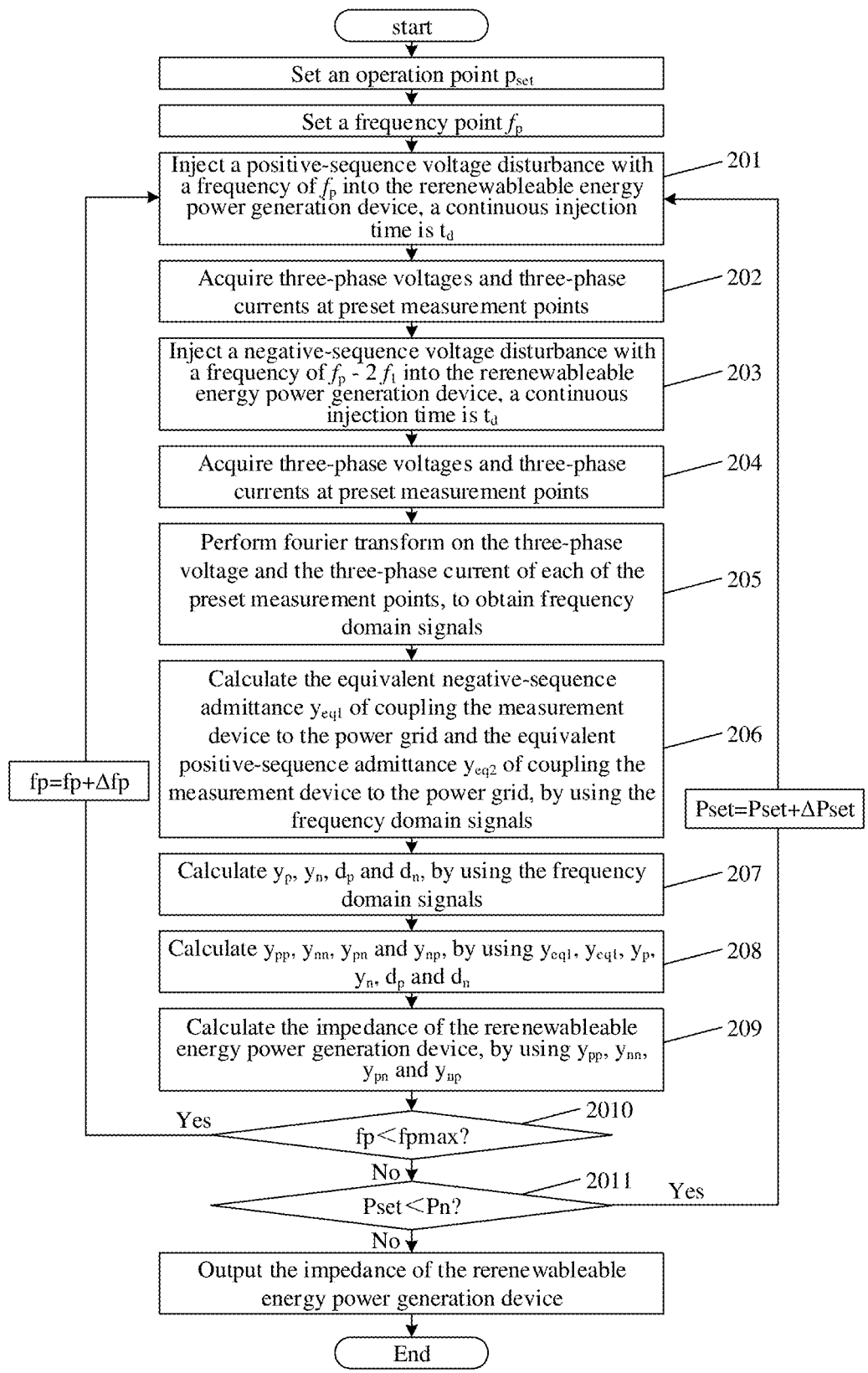
FIG. 3 is a flowchart of a method for measuring broadband impedance of a renewable energy power generation device provided in an embodiment of the disclosure.

For example, the operation point of the renewable energy power generation device is set to be $P_{set}$, $P_{set}$ is increased multiple times, by $\Delta P_{set}$ each time, from zero power to rated power; at each operation point $P_{set}$ of the renewable energy power generation device, a frequency point $f_p$ is set, and the frequency point $f_p$ is increased multiple times, by $\Delta f_p$ each time, from 1 Hz to 5000 Hz. Specifically, as shown in FIG. 3, the impedance of the renewable energy power generation device under influence of the impedance of the power grid and the measurement device is measured at each operation point and each frequency point by using the method for measuring broadband impedance of the renewable energy power generation device of the disclosure, which includes the following operations 201 to 2011.

At 201, in a preset measurement period $T_m$, at the operation point $P_{set}$ of the renewable energy power generation device, a positive-sequence voltage disturbance with a frequency of $f_p$ is injected into the renewable energy power generation device by using the disturbance injection device, a continuous injection time of the positive-sequence voltage disturbance is $T_d$, and operation 202 is executed while the positive-sequence voltage disturbance is injected.

At 202, three-phase voltages and three-phase currents at preset measurement points are continuously acquired; at this time, first three-phase voltages of the first measurement point M1, the second measurement point M2 and the third measurement point M3 are $v_{a1}$, $v_{b1}$ and $v_{c1}$ respectively, first three-phase currents of the first measurement point M1, the second measurement point M2 and the third measurement point M3 are $i_{a1}$, $i_{b1}$ and $i_{c1}$ respectively, the sampling time reaches $T_d$, and operation 203 is executed.

At 203, a negative-sequence voltage disturbance with a frequency of $f_p-2f_1$ is injected into the renewable energy power generation device by using the disturbance injection device, a continuous injection time of the negative-sequence voltage disturbance is $T_d$, and operation 204 is executed while the negative-sequence voltage disturbance is injected.

At 204, three-phase voltages and three-phase currents at preset measurement points are continuously acquired; at this time, second three-phase voltages of the first measurement point M1, the second measurement point M2 and the third measurement point M3 are $v_{a2}$, $v_{b2}$ and $v_{c2}$ respectively, second three-phase currents of the first measurement point M1, the second measurement point M2 and the third measurement point M3 are $i_{a2}$, $i_{b2}$ and $i_{c2}$ respectively, the sampling time reaches $T_d$, and operation 205 is executed.

At 205, Fourier transform is performed on the three-phase voltage and the three-phase current of each of the preset measurement points, to obtain frequency domain signals.

Specifically, Fourier transform is performed on $v_{a1}$, $v_{b1}$ and $v_{c1}$ at the first preset frequency, to obtain the first disturbance voltage positive-sequence frequency domain signal; Fourier transform is performed on $v_{a1}$, $v_{b1}$ and $v_{c1}$ at the second preset frequency, to obtain the first disturbance voltage negative-sequence frequency domain signal; Fourier transform is performed on $i_{a1}$, $i_{b1}$ and $i_{c1}$ at the first preset frequency, to obtain the first disturbance current positive-sequence frequency domain signal; Fourier transform is performed on $i_{a1}$, $i_{b1}$ and $i_{c1}$ at the second preset frequency, to obtain the first disturbance current negative-sequence frequency domain signal.

Fourier transform is performed on $v_{a2}$, $v_{b2}$ and $v_{c2}$ at the first preset frequency, to obtain the second disturbance voltage positive-sequence frequency domain signal; Fourier transform is performed on $v_{a2}$, $v_{b2}$ and $v_{c2}$ at the second preset frequency, to obtain the second disturbance voltage negative-sequence frequency domain signal; Fourier transform is performed on $i_{a2}$, $i_{b2}$ and $i_{c2}$ at the first preset frequency, to obtain the second disturbance current positive-sequence frequency domain signal; Fourier transform is performed on $i_{a2}$, $i_{b2}$ and $i_{c2}$ at the second preset frequency, to obtain the second disturbance current negative-sequence frequency domain signal.

At 206, when the positive-sequence voltage disturbance is injected at first, the equivalent negative-sequence admittance $Y_{eq1}$ of coupling the measurement device to the power grid is calculated by using the frequency domain signals; when the negative-sequence voltage disturbance is injected secondly, the equivalent positive-sequence admittance $Y_{eq2}$ of coupling the measurement device to the power grid is calculated by using the frequency domain signals.

At 207, the positive-sequence admittance $Y_p$ before the renewable energy power generation device is decoupled from the measurement device, the negative-sequence admittance $Y_n$ before the renewable energy power generation device is decoupled from the measurement device, the ratio $D_p$ of the negative-sequence voltage to the positive-sequence voltage when the positive-sequence voltage disturbance is injected, and the ratio $D_n$ of the negative-sequence voltage to the positive-sequence voltage when the negative-sequence voltage disturbance is injected, are calculated by using the frequency domain signals.

At 208, the positive-sequence admittance $Y_{pp}$ of the renewable energy power generation device and the connection line, the negative-sequence admittance $Y_{nn}$ of the renewable energy power generation device and the connection line, the positive-sequence coupling admittance $Y_{pn}$ of the renewable energy power generation device and the connection line, and the negative-sequence coupling admittance $Y_{np}$ of the renewable energy power generation device and the connection line, are calculated by using the equivalent negative-sequence admittance $Y_{eq1}$ of coupling the measurement device to the power grid, the equivalent positive-sequence admittance $Y_{eq2}$ of coupling the measurement device to the power grid, the positive-sequence admittance $Y_p$ before the renewable energy power generation device is decoupled from the measurement device, the negative-sequence admittance $Y_n$ before the renewable energy power generation device is decoupled from the measurement device, the ratio $D_p$ of the negative-sequence voltage to the positive-sequence voltage when the positive-sequence voltage disturbance is injected, and the ratio $D_n$ of the negative-sequence voltage to the positive-sequence voltage when the negative-sequence voltage disturbance is injected.

At 209, the impedance $Z_{RE}$ of the renewable energy power generation device is calculated by using the positive-sequence admittance $Y_{pp}$ of the renewable energy power generation device and the connection line, the negative-sequence admittance $Y_{nn}$ of the renewable energy power generation device and the connection line, the positive-sequence coupling admittance $Y_{pn}$ of the renewable energy power generation device and the connection line, and the negative-sequence coupling admittance $Y_{np}$ of the renewable energy power generation device and the connection line.

At 2010, it is determined whether $f_p$ is less than $f_{pmax}$. If $f_p$ is less than $f_{pmax}$, $f_p=f_p+\Delta f_p$, and it returns to operation 201; if $f_p$ is equal to or greater than $f_{pmax}$, operation 2011 is executed, here $f_{pmax}$ is a preset maximum frequency (i.e., 5000 Hz).

At 2011, it is determined whether $P_{set}$ is less than $P_n$. If $P_{set}$ is less than $P_n$, $P_{set}=P_{set}+\Delta P_{set}$, and it returns to operation 201; if $P_{set}$ is equal to or greater than $P_n$, the impedance of the renewable energy power generation device is output, and the process ends, here $P_{set}$ is rated power of the renewable energy power generation device.

It may be understood that since the impedance of the renewable energy power generation device is impedance at each frequency point corresponding to each operation point, assuming that a total number of operation points is n and a total number of frequency points is m, then the output impedance of the renewable energy power generation device includes n groups, each group contains m impedances.

Third Embodiment

The disclosure further provides a system for measuring broadband impedance of a renewable energy power generation device, the renewable energy power generation device is connected to three-phase transmission lines of a power grid through primary sides of three coupling transformers T1 in a measurement device respectively; one end of a secondary side of each of the three coupling transformers T1 in the measurement device is connected to a respective output of a disturbance injection device in the measurement device, and another end of the secondary side of each of the three coupling transformers T1 is connected to one another.

Figure 4:
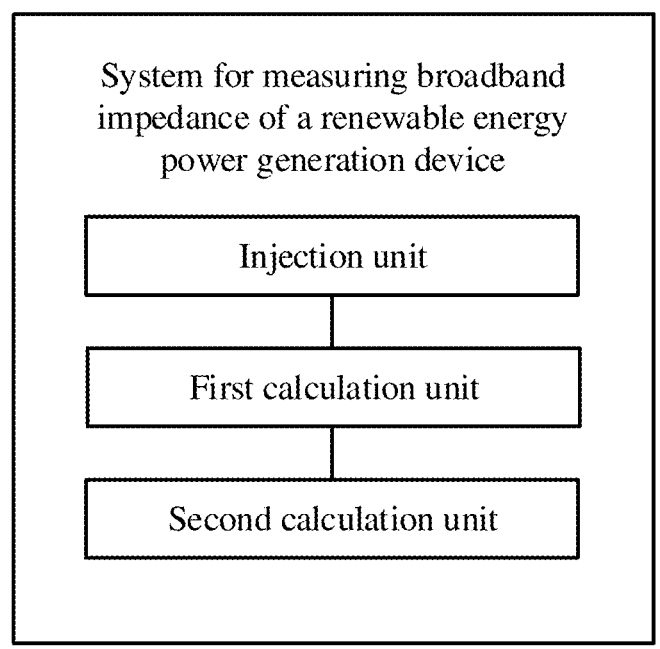
FIG. 4 is a structural block diagram of a system for measuring broadband impedance of a renewable energy power generation device provided in an embodiment of the disclosure.

As shown in FIG. 4, the system for measuring broadband impedance of the renewable energy power generation device provided in the disclosure includes an injection unit, a first calculation unit, and a second calculation unit.

The injection unit is configured to inject, by using the disturbance injection device, a voltage disturbance into the renewable energy power generation device, and acquire three-phase voltage and three-phase current of each of preset measurement points.

The first calculation unit is configured to calculate relevant variables before the renewable energy power generation device is decoupled from the measurement device and impedance of the power grid, according to the three-phase voltage and the three-phase current of each of the preset measurement points.

The second calculation unit is configured to calculate impedance of the renewable energy power generation device after being decoupled from the measurement device and the impedance of the power grid, by using the relevant variables before the renewable energy power generation device is decoupled from the measurement device and the impedance of the power grid.

Furthermore, a first inductor L1 is arranged on each phase of the three-phase transmission lines between the renewable energy power generation device and a respective one of the coupling transformers T1, and a second inductor L2 is arranged on each phase of the three-phase transmission lines between a respective one of the coupling transformers T1 and the power grid.

Each of the preset measurement points is selected from a respective phase of the three-phase transmission lines between a respective one of the coupling transformers T1 and the first inductor L1.

Furthermore, the injection unit is specifically configured to:
in a preset measurement period $T_m$, at each of preset operation points of the renewable energy power generation device, inject, by using the disturbance injection device, a positive-sequence voltage disturbance at each first preset frequency into the renewable energy power generation device, and acquire a first three-phase voltage and a first three-phase current of each of the preset measurement points, until a continuous injection time of the positive-sequence voltage disturbance reaches $T_d$, at which injection of the positive-sequence voltage disturbance is stopped; and in the preset measurement period $T_m$, at each of the preset operation points of the renewable energy power generation device, inject, by using the disturbance injection device, a negative-sequence voltage disturbance at each second preset frequency into the renewable energy power generation device, and acquire a second three-phase voltage and a second three-phase current of each of the preset measurement points, until a continuous injection time of the negative-sequence voltage disturbance reaches $T_d$, at which injection of the negative-sequence voltage disturbance is stopped, here $T_d<(T_m/2)$.

Furthermore, the first preset frequency and the second preset frequency meet a formula:

$$f_{pp}=f_p-2f_1$$

here $f_p$ is the first preset frequency, $f_{pp}$ is the second preset frequency, and $f_1$ is a rated frequency of the power grid.

Furthermore, the first calculation unit includes a transformation module and a first calculation module.

The transformation module is configured to perform Fourier transform on the three-phase voltage and the three-phase current of each of the preset measurement points, to obtain frequency domain signals.

The first calculation module is configured to calculate the relevant variables before the renewable energy power generation device is decoupled from the measurement device and the impedance of the power grid, by using the frequency domain signals.

Furthermore, the frequency domain signals include: a first disturbance voltage positive-sequence frequency domain signal, a first disturbance voltage negative-sequence frequency domain signal, a first disturbance current positive-sequence frequency domain signal, a first disturbance current negative-sequence frequency domain signal, a second disturbance voltage positive-sequence frequency domain signal, a second disturbance voltage negative-sequence frequency domain signal, a second disturbance current positive-sequence frequency domain signal, and a second disturbance current negative-sequence frequency domain signal.

The relevant variables before the renewable energy power generation device is decoupled from the measurement device and the impedance of the power grid include: an equivalent negative-sequence admittance of coupling the measurement device to the power grid, an equivalent positive-sequence admittance of coupling the measurement device to the power grid, a positive-sequence admittance before the renewable energy power generation device is decoupled from the measurement device, a negative-sequence admittance before the renewable energy power generation device is decoupled from the measurement device, a ratio of a negative-sequence voltage to a positive-sequence voltage when a positive-sequence voltage disturbance is injected, and a ratio of a negative-sequence voltage to a positive-sequence voltage when a negative-sequence voltage disturbance is injected.

Furthermore, the transformation module is specifically configured to:
perform Fourier transform on a first three-phase voltage of each of the preset measurement points at a first preset frequency, to obtain the first disturbance voltage positive-sequence frequency domain signal; perform Fourier transform on the first three-phase voltage of each of the preset measurement points at a second preset frequency, to obtain the first disturbance voltage negative-sequence frequency domain signal; perform Fourier transform on a first three-phase current of each of the preset measurement points at the first preset frequency, to obtain the first disturbance current positive-sequence frequency domain signal; perform Fourier transform on the first three-phase current of each of the preset measurement points at the second preset frequency, to obtain the first disturbance current negative-sequence frequency domain signal; and perform Fourier transform on a second three-phase voltage of each of the preset measurement points at the first preset frequency, to obtain the second disturbance voltage positive-sequence frequency domain signal; perform Fourier transform on the second three-phase voltage of each of the preset measurement points at the second preset frequency, to obtain the second disturbance voltage negative-sequence frequency domain signal; perform Fourier transform on a second three-phase current of each of the preset measurement points at the first preset frequency, to obtain the second disturbance current positive-sequence frequency domain signal; perform Fourier transform on the second three-phase current of each of the preset measurement points at the second preset frequency, to obtain the second disturbance current negative-sequence frequency domain signal.

Furthermore, the equivalent negative-sequence admittance of coupling the measurement device to the power grid is calculated by using a formula:

$$Y_{eq1} = -i_{n1}/v_{n1}$$

here $Y_{eq1}$ is the equivalent negative-sequence admittance of coupling the measurement device to the power grid, $i_{n1}$ is the first disturbance current negative-sequence frequency domain signal, and $v_{n1}$ is the first disturbance voltage negative-sequence frequency domain signal.

The equivalent positive-sequence admittance of coupling the measurement device to the power grid is calculated by using a formula:

$$Y_{eq2} = -i_{p2}/v_{p2}$$

here $Y_{eq2}$ is the equivalent positive-sequence admittance of coupling the measurement device to the power grid, $i_{p2}$ is the second disturbance current positive-sequence frequency domain signal, and $v_{p2}$ is the second disturbance voltage positive-sequence frequency domain signal.

The positive-sequence admittance before the renewable energy power generation device is decoupled from the measurement device is calculated by using a formula:

$$Y_p = i_{p1}/v_{p1}$$

here $Y_p$ is the positive-sequence admittance before the renewable energy power generation device is decoupled from the measurement device, $i_{p1}$ is the first disturbance current positive-sequence frequency domain signal, and $v_{p1}$ is the first disturbance voltage positive-sequence frequency domain signal.

The negative-sequence admittance before the renewable energy power generation device is decoupled from the measurement device is calculated by using a formula:

$$Y_n = i_{n2}/v_{n2}$$

here $Y_n$ is the negative-sequence admittance before the renewable energy power generation device is decoupled from the measurement device, $i_{n2}$ is the second disturbance current negative-sequence frequency domain signal, and $v_{n2}$ is the second disturbance voltage negative-sequence frequency domain signal.

The ratio of the negative-sequence voltage to the positive-sequence voltage when the positive-sequence voltage disturbance is injected is calculated by using a formula:

$$D_p = v_{n1}/v_{p1}$$

here $D_p$ is the ratio of the negative-sequence voltage to the positive-sequence voltage when the positive-sequence voltage disturbance is injected.

The ratio of the negative-sequence voltage to the positive-sequence voltage when the negative-sequence voltage disturbance is injected is calculated by using a formula:

$$D_n = v_{p2}/v_{n2}$$

here $D_n$ is the ratio of the negative-sequence voltage to the positive-sequence voltage when the negative-sequence voltage disturbance is injected.

Furthermore, the second calculation unit includes a second calculation module and a third calculation module.

The second calculation module is configured to calculate relevant variables after the renewable energy power generation device is decoupled from the measurement device and the impedance of the power grid, by using the relevant variables before the renewable energy power generation device is decoupled from the measurement device and the impedance of the power grid.

The third calculation module is configured to calculate the impedance of the renewable energy power generation device, by using the relevant variables after the renewable energy power generation device is decoupled from the measurement device and the impedance of the power grid.

Furthermore, the relevant variables after the renewable energy power generation device is decoupled from the measurement device and the impedance of the power grid include:

a positive-sequence admittance of the renewable energy power generation device and a connection line, a negative-sequence admittance of the renewable energy power generation device and the connection line, a positive-sequence coupling admittance of the renewable energy power generation device and the connection line, and a negative-sequence coupling admittance of the renewable energy power generation device and the connection line.

Furthermore, the second calculation module includes a first calculation submodule, a second calculation submodule, a third calculation submodule, and a fourth calculation submodule.

The first calculation submodule is configured to calculate the positive-sequence admittance of the renewable energy power generation device and the connection line, by using the positive-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent negative-sequence admittance of coupling the measurement device to the power grid.

The second calculation submodule is configured to calculate the negative-sequence admittance of the renewable energy power generation device and the connection line, by using the negative-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent positive-sequence admittance of coupling the measurement device to the power grid.

The third calculation submodule is configured to calculate the negative-sequence coupling admittance of the renewable energy power generation device and the connection line, by using the positive-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent negative-sequence admittance of coupling the measurement device to the power grid.

The fourth calculation submodule is configured to calculate the positive-sequence coupling admittance of the renewable energy power generation device and the connection line, by using the negative-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent positive-sequence admittance of coupling the measurement device to the power grid.

Furthermore, the positive-sequence admittance of the renewable energy power generation device and the connection line is calculated by using a formula:

$$Y_{pp} = \frac{Y_p - D_p D_n Y_{eq1}}{1 - D_p D_n}$$

here $Y_{pp}$ is the positive-sequence admittance of the renewable energy power generation device and the connection line, $Y_p$ is the positive-sequence admittance before the renewable energy power generation device is decoupled from the measurement device, $D_p$ is the ratio of the negative-sequence voltage to the positive-sequence voltage when the positive-sequence voltage disturbance is injected, $D_n$ is the ratio of the negative-sequence voltage to the positive-sequence voltage when the negative-sequence voltage disturbance is injected, and $Y_{eq1}$ is the equivalent negative-sequence admittance of coupling the measurement device to the power grid.

The negative-sequence admittance of the renewable energy power generation device and the connection line is calculated by using a formula:

$$Y_{nn} = \frac{Y_n - D_p D_n Y_{eq2}}{1 - D_p D_n}$$

here $Y_{nn}$ is the negative-sequence admittance of the renewable energy power generation device and the connection line, $Y_{eq2}$ is the equivalent positive-sequence admittance of coupling the measurement device to the power grid, and $Y_n$ is the negative-sequence admittance before the renewable energy power generation device is decoupled from the measurement device.

The negative-sequence coupling admittance of the renewable energy power generation device and the connection line is calculated by using a formula:

$$Y_{np} = -D_n \left( \frac{Y_p - D_p D_n Y_{eq1}}{1 - D_p D_n} + Y_{eq1} \right)$$

here $Y_{np}$ is the negative-sequence coupling admittance of the renewable energy power generation device and the connection line.

The positive-sequence coupling admittance of the renewable energy power generation device and the connection line is calculated by using a formula:

$$Y_{pn} = -D_p \left( \frac{Y_n - D_p D_n Y_{eq2}}{1 - D_p D_n} + Y_{eq2} \right)$$

here $Y_{pn}$ is the positive-sequence coupling admittance of the renewable energy power generation device and the connection line.

Furthermore, the third calculation module is specifically configured to:

calculate the impedance of the renewable energy power generation device, by using the positive-sequence admittance of the renewable energy power generation device and the connection line, the negative-sequence admittance of the renewable energy power generation device and the connection line, the positive-sequence coupling admittance of the renewable energy power generation device and the connection line, and the negative-sequence coupling admittance of the renewable energy power generation device and the connection line.

Furthermore, the impedance $Z_{RE}$ of the renewable energy power generation device is calculated by using a formula:

$$Z_{RE} = \begin{bmatrix} Y_{pp} & Y_{np} \\ Y_{pn} & Y_{nn} \end{bmatrix}^{-1} - Z_{line}$$

here $Z_{RE}$ is the impedance of the renewable energy power generation device, $Y_{pp}$ is the positive-sequence admittance of the renewable energy power generation device and the connection line, $Y_{nn}$ is the negative-sequence admittance of the renewable energy power generation device and the connection line, $Y_{np}$ is the negative-sequence coupling admittance of the renewable energy power generation device and the connection line, $Y_{pn}$ is the positive-sequence coupling admittance of the renewable energy power generation device and the connection line, and $Z_{line}$ is impedance of the three-phase transmission lines between the renewable energy power generation device and the coupling transformers T1.

Furthermore, the impedance of the three-phase transmission lines between the renewable energy power generation device and the coupling transformers T1 is calculated by using a formula:

$$Z_{line} = \begin{bmatrix} j2\pi f_p L_{line} & 0 \\ 0 & j2\pi(f_p - 2f_1)L_{line} \end{bmatrix}$$

here $Z_{line}$ is the impedance of the three-phase transmission lines between the renewable energy power generation device and the coupling transformers T1, j is an imaginary part symbol, $f_p$ is a first preset frequency, $L_{line}$ is an inductance value of the three-phase transmission lines between the renewable energy power generation device and the coupling transformers T1, and $f_1$ is a rated frequency of the power grid.

It may be understood that the system embodiment provided as above corresponds to the above method embodiment, and corresponding specific contents may refer to each other and are not elaborated here.

It may be understood that the same or similar parts of the above embodiments may refer to each other, and contents which are not described in detail in some embodiments may refer to the same or similar contents in other embodiments.

Fourth Embodiment

Based on the same inventive concept, the disclosure further provides a computer device, the computer device includes a processor and a memory, the memory is configured to store a computer program, the computer program includes program instructions, and the processor is configured to execute the program instructions stored in a computer storage medium. The processor may be a Central Processing Unit (CPU), or may be other general-purpose processors, Digital Signal Processor (DSP), Application Specific Integrated Circuit (ASIC), Field-Programmable Gate Array (FPGA), or other programmable logic devices, discrete gates or transistor logic devices, discrete hardware components, etc. The processor is a computing core and control core of a terminal, and is suitable for implementing one or more instructions, specifically suitable for loading and executing one or more instructions in the computer storage medium, to implement corresponding method processes or corresponding functions, so as to implement operations of the method for measuring broadband impedance of the renewable energy power generation device in the above embodiment.

Fifth Embodiment

Based on the same inventive concept, the disclosure further provides a storage medium, specifically a computer-readable storage medium (memory), the computer-readable storage medium is a memory device in a computer device and configured to store programs and data. It may be understood that the computer-readable storage medium here may include a built-in storage medium in the computer device, of course, may also include an extended storage medium supported by the computer device. The computer-readable storage medium provides a storage space, and an operating system of the terminal is stored in the storage space. Furthermore, one or more instructions suitable for being loaded and executed by the processor are also stored in the storage space. These instructions may be one or more computer programs (including program codes). It should be noted that the computer-readable storage medium here may be a high-speed Random Access Memory (RAM) memory, or may be a non-volatile memory, such as at least one disk memory. One or more instructions stored in the computer-readable storage medium may be loaded and executed by the processor, to implement operations of the method for measuring broadband impedance of the renewable energy power generation device in the above embodiment.

It should be appreciated by those skilled in the art that the embodiments of the disclosure may be provided as a method, a system, or a computer program product. Therefore, the disclosure may take a form of an entire hardware embodiment, an entire software embodiment, or an embodiment combining software and hardware aspects. Furthermore, the disclosure may take a form of a computer program product implemented on one or more computer-available storage media (include, but are not limited to a disk memory, a Compact Disc Read-Only Memory (CD-ROM), an optical memory, etc.) where computer-available program codes are included.

The disclosure is described with reference to flowcharts and/or block diagrams of the method, device (system) and computer program product according to the embodiments of the disclosure. It should be understood that each process and/or block in the flowchart and/or block diagram, and a combination of processes and/or blocks in the flowchart and/or block diagram may be implemented by computer program instructions. These computer program instructions may be provided to a processor of a general-purpose computer, a special-purpose computer, an embedded processor or other programmable data processing device to produce a machine, so that the instructions executed by the computer or processors of other programmable data processing devices produce a device configured to implement functions specified in one or more processes of the flowchart and/or one or more blocks of the block diagram.

These computer program instructions may also be stored in a computer-readable memory which may direct a computer or other programmable data processing devices to operate in a specific manner, so that the instructions stored in the computer-readable memory produce a manufactured product including an instruction device, and the instruction device implements the functions specified in one or more processes of the flowchart and/or one or more blocks of the block diagram.

These computer program instructions may also be loaded onto a computer or other programmable data processing devices, so that a series of operational steps are executed on the computer or other programmable devices to produce a computer-implemented process, therefore the instructions executed on the computer or other programmable devices provide operations of implementing the functions specified in one or more processes of the flowchart and/or one or more blocks of the block diagram.

Finally, it should be noted that the above embodiments are only intended to explain the technical solutions of the disclosure, rather than to limit these technical solutions. Although the disclosure has been described in detail with reference to the above embodiments, it should be understood by those of ordinary skill in the art that modification or equivalent replacement may still be made to specific implementations of the disclosure, and any modification or equivalent replacement which does not depart from the spirit and scope of the disclosure should fall within the scope of protection of the claims of the disclosure.

The invention claimed is:

1. A method for measuring broadband impedance of a renewable energy power generation device, wherein the renewable energy power generation device is connected to three-phase transmission lines of a power grid through primary sides of three coupling transformers in a measurement device respectively; one end of a secondary side of each of the three coupling transformers in the measurement device is connected to a respective output of a disturbance injection device in the measurement device, and another end of the secondary side of each of the three coupling transformers is connected to one another, and
wherein the method for measuring broadband impedance of the renewable energy power generation device comprises:
injecting a voltage disturbance into the renewable energy power generation device by using the disturbance injection device, and acquiring three-phase voltage and three-phase current of each of preset measurement points;
calculating relevant variables before the renewable energy power generation device is decoupled from the measurement device and impedance of the power grid, according to the three-phase voltage and the three-phase current of each of the preset measurement points; and
calculating impedance of the renewable energy power generation device after being decoupled from the measurement device and the impedance of the power grid, by using the relevant variables before the renewable energy power generation device is decoupled from the measurement device and the impedance of the power grid,
wherein calculating the relevant variables before the renewable energy power generation device is decoupled from the measurement device and the impedance of the power grid, according to the three-phase voltage and the three-phase current of each of the preset measurement points comprises:

performing Fourier transform on the three-phase voltage and the three-phase current of each of the preset measurement points, to obtain frequency domain signals; and calculating the relevant variables before the renewable energy power generation device is decoupled from the measurement device and the impedance of the power grid, by using the frequency domain signals, wherein the frequency domain signals comprise: a first disturbance voltage positive-sequence frequency domain signal, a first disturbance voltage negative-sequence frequency domain signal, a first disturbance current positive-sequence frequency domain signal, a first disturbance current negative-sequence frequency domain signal, a second disturbance voltage positive-sequence frequency domain signal, a second disturbance voltage negative-sequence frequency domain signal, a second disturbance current positive-sequence frequency domain signal, and a second disturbance current negative-sequence frequency domain signal, the relevant variables before the renewable energy power generation device is decoupled from the measurement device and the impedance of the power grid comprise: an equivalent negative-sequence admittance of coupling the measurement device to the power grid, an equivalent positive-sequence admittance of coupling the measurement device to the power grid, a positive-sequence admittance before the renewable energy power generation device is decoupled from the measurement device, a negative-sequence admittance before the renewable energy power generation device is decoupled from the measurement device, a ratio of a negative-sequence voltage to a positive-sequence voltage when a positive-sequence voltage disturbance is injected, and a ratio of a negative-sequence voltage to a positive-sequence voltage when a negative-sequence voltage disturbance is injected, and wherein the equivalent negative-sequence admittance of coupling the measurement device to the power grid is calculated by using a formula:

$$Y_{eq1} = -i_{n1}/v_{n1}$$

wherein $Y_{eq1}$ is the equivalent negative-sequence admittance of coupling the measurement device to the power grid, $i_{n1}$ is the first disturbance current negative-sequence frequency domain signal, and $v_{n1}$ is the first disturbance voltage negative-sequence frequency domain signal;

the equivalent positive-sequence admittance of coupling the measurement device to the power grid is calculated by using a formula:

$$Y_{eq2} = -i_{p2}/v_{p2}$$

wherein $Y_{eq2}$ is the equivalent positive-sequence admittance of coupling the measurement device to the power grid, $i_{p2}$ is the second disturbance current positive-sequence frequency domain signal, and $v_{p2}$ is the second disturbance voltage positive-sequence frequency domain signal;

the positive-sequence admittance before the renewable energy power generation device is decoupled from the measurement device is calculated by using a formula:

$$Y_p = i_{p1}/v_{p1}$$

wherein $Y_p$ is the positive-sequence admittance before the renewable energy power generation device is decoupled from the measurement device, $i_{p1}$ is the first disturbance current positive-sequence frequency domain signal, and $v_{p1}$ is the first disturbance voltage positive-sequence frequency domain signal;

the negative-sequence admittance before the renewable energy power generation device is decoupled from the measurement device is calculated by using a formula:

$$Y_n = i_{n2}/v_{n2}$$

wherein $Y_n$ is the negative-sequence admittance before the renewable energy power generation device is decoupled from the measurement device, $i_{n2}$ is the second disturbance current negative-sequence frequency domain signal, and $v_{n2}$ is the second disturbance voltage negative-sequence frequency domain signal;

the ratio of the negative-sequence voltage to the positive-sequence voltage when the positive-sequence voltage disturbance is injected is calculated by using a formula:

$$D_p = v_{n1}/v_{p1}$$

wherein $D_p$ is the ratio of the negative-sequence voltage to the positive-sequence voltage when the positive-sequence voltage disturbance is injected;

the ratio of the negative-sequence voltage to the positive-sequence voltage when the negative-sequence voltage disturbance is injected is calculated by using a formula:

$$D_n = v_{p2}/v_{n2}$$

wherein $D_n$ is the ratio of the negative-sequence voltage to the positive-sequence voltage when the negative-sequence voltage disturbance is injected.

2. The method of claim 1, wherein a first inductor is arranged on each phase of the three-phase transmission lines between the renewable energy power generation device and a respective one of the coupling transformers, and a second inductor is arranged on each phase of the three-phase transmission lines between a respective one of the coupling transformers and the power grid, each of the preset measurement points is selected from a respective phase of the three-phase transmission lines between a respective one of the coupling transformers and the first inductor.

3. The method of claim 1, wherein injecting the voltage disturbance into the renewable energy power generation device by using the disturbance injection device, and acquiring the three-phase voltage and the three-phase current of each of the preset measurement points comprises:

in a preset measurement period $T_m$, at each of preset operation points of the renewable energy power generation device, injecting, by using the disturbance injection device, a positive-sequence voltage disturbance at each first preset frequency into the renewable energy power generation device, and acquiring a first three-phase voltage and a first three-phase current of each of the preset measurement points, until a continuous injection time of the positive-sequence voltage disturbance reaches $T_d$, at which injection of the positive-sequence voltage disturbance is stopped; and in the preset measurement period $T_m$, at each of the preset operation points of the renewable energy power generation device, injecting, by using the disturbance injection device, a negative-sequence voltage disturbance at each second preset frequency into the renewable energy power generation device, and acquiring a second three-phase voltage and a second three-phase current of each of the preset measurement points, until a continuous injection time of the negative-sequence voltage disturbance reaches $T_d$, at which injection of the negative-sequence voltage disturbance is stopped, wherein $T_d < (T_m/2)$.

4. The method of claim 3, wherein the first preset frequency and the second preset frequency meet a formula:

$$f_{pp} = f_p - 2f_1$$

wherein $f_p$ is the first preset frequency, $f_{pp}$ is the second preset frequency, and $f_1$ is a rated frequency of the power grid.

5. The method of claim 1, wherein performing the Fourier transform on the three-phase voltage and the three-phase current of each of the preset measurement points, to obtain the frequency domain signals comprises:

performing Fourier transform on a first three-phase voltage of each of the preset measurement points at a first preset frequency, to obtain the first disturbance voltage positive-sequence frequency domain signal; performing Fourier transform on the first three-phase voltage of each of the preset measurement points at a second preset frequency, to obtain the first disturbance voltage negative-sequence frequency domain signal; performing Fourier transform on a first three-phase current of each of the preset measurement points at the first preset frequency, to obtain the first disturbance current positive-sequence frequency domain signal; and performing Fourier transform on the first three-phase current of each of the preset measurement points at the second preset frequency, to obtain the first disturbance current negative-sequence frequency domain signal; and performing Fourier transform on a second three-phase voltage of each of the preset measurement points at the first preset frequency, to obtain the second disturbance voltage positive-sequence frequency domain signal; performing Fourier transform on the second three-phase voltage of each of the preset measurement points at the second preset frequency, to obtain the second disturbance voltage negative-sequence frequency domain signal; performing Fourier transform on a second three-phase current of each of the preset measurement points at the first preset frequency, to obtain the second disturbance current positive-sequence frequency domain signal; and performing Fourier transform on the second three-phase current of each of the preset measurement points at the second preset frequency, to obtain the second disturbance current negative-sequence frequency domain signal.

6. The method of claim 1, wherein calculating the impedance of the renewable energy power generation device after being decoupled from the measurement device and the impedance of the power grid, by using the relevant variables before the renewable energy power generation device is decoupled from the measurement device and the impedance of the power grid comprises:

calculating relevant variables after the renewable energy power generation device is decoupled from the measurement device and the impedance of the power grid, by using the relevant variables before the renewable energy power generation device is decoupled from the measurement device and the impedance of the power grid; and calculating the impedance of the renewable energy power generation device, by using the relevant variables after the renewable energy power generation device is decoupled from the measurement device and the impedance of the power grid.

7. The method of claim 6, wherein the relevant variables after the renewable energy power generation device is decoupled from the measurement device and the impedance of the power grid comprise:

a positive-sequence admittance of the renewable energy power generation device and a connection line, a negative-sequence admittance of the renewable energy power generation device and the connection line, a positive-sequence coupling admittance of the renewable energy power generation device and the connection line, and a negative-sequence coupling admittance of the renewable energy power generation device and the connection line.

8. The method of claim 7, wherein calculating the relevant variables after the renewable energy power generation device is decoupled from the measurement device and the impedance of the power grid, by using the relevant variables before the renewable energy power generation device is decoupled from the measurement device and the impedance of the power grid comprises:

calculating the positive-sequence admittance of the renewable energy power generation device and the connection line, by using the positive-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent negative-sequence admittance of coupling the measurement device to the power grid;

calculating the negative-sequence admittance of the renewable energy power generation device and the connection line, by using the negative-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent positive-sequence admittance of coupling the measurement device to the power grid;

calculating the negative-sequence coupling admittance of the renewable energy power generation device and the connection line, by using the positive-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent negative-sequence admittance of coupling the measurement device to the power grid; and calculating the positive-sequence coupling admittance of the renewable energy power generation device and the connection line, by using the negative-sequence admittance before the renewable energy power generation device is decoupled from the measurement device, the ratio of the negative-sequence voltage to the positive-sequence voltage when the positive-sequence voltage disturbance is injected, the ratio of the negative-sequence voltage to the positive-sequence voltage when the negative-sequence voltage disturbance is injected, and the equivalent positive-sequence admittance of coupling the measurement device to the power grid.

9. The method of claim 8, wherein the positive-sequence admittance of the renewable energy power generation device and the connection line is calculated by using a formula:

$$Y_{pp} = \frac{Y_p - D_p D_n Y_{eq1}}{1 - D_p D_n}$$

wherein $Y_{pp}$ is the positive-sequence admittance of the renewable energy power generation device and the connection line, $Y_p$ is the positive-sequence admittance before the renewable energy power generation device is decoupled from the measurement device, $D_p$ is the ratio of the negative-sequence voltage to the positive-sequence voltage when the positive-sequence voltage disturbance is injected, $D_n$ is the ratio of the negative-sequence voltage to the positive-sequence voltage when the negative-sequence voltage disturbance is injected, and $Y_{eq1}$ is the equivalent negative-sequence admittance of coupling the measurement device to the power grid;

the negative-sequence admittance of the renewable energy power generation device and the connection line is calculated by using a formula:

$$Y_{nn} = \frac{Y_n - D_p D_n Y_{eq2}}{1 - D_p D_n}$$

wherein $Y_{nn}$ is the negative-sequence admittance of the renewable energy power generation device and the connection line, $Y_{eq2}$ is the equivalent positive-sequence admittance of coupling the measurement device to the power grid, and $Y_n$ is the negative-sequence admittance before the renewable energy power generation device is decoupled from the measurement device;

the negative-sequence coupling admittance of the renewable energy power generation device and the connection line is calculated by using a formula:

$$Y_{np} = -D_n \left( \frac{Y_p - D_p D_n Y_{eq1}}{1 - D_p D_n} + Y_{eq1} \right)$$

wherein $Y_{np}$ is the negative-sequence coupling admittance of the renewable energy power generation device and the connection line;

the positive-sequence coupling admittance of the renewable energy power generation device and the connection line is calculated by using a formula:

$$Y_{pn} = -D_p \left( \frac{Y_n - D_p D_n Y_{eq2}}{1 - D_p D_n} + Y_{eq2} \right)$$

wherein $Y_{pn}$ is the positive-sequence coupling admittance of the renewable energy power generation device and the connection line.

10. The method of claim 7, wherein calculating the impedance of the renewable energy power generation device, by using the relevant variables after the renewable energy power generation device is decoupled from the measurement device and the impedance of the power grid comprises:

calculating the impedance of the renewable energy power generation device, by using the positive-sequence admittance of the renewable energy power generation device and the connection line, the negative-sequence admittance of the renewable energy power generation device and the connection line, the positive-sequence coupling admittance of the renewable energy power generation device and the connection line, and the negative-sequence coupling admittance of the renewable energy power generation device and the connection line.

11. The method of claim 10, wherein the impedance $Z_{RE}$ of the renewable energy power generation device is calculated by using a formula:

$$Z_{RE} = \begin{bmatrix} Y_{pp} & Y_{np} \\ Y_{pn} & Y_{nn} \end{bmatrix}^{-1} - Z_{line}$$

wherein $Z_{RE}$ is the impedance of the renewable energy power generation device, $Y_{pp}$ is the positive-sequence admittance of the renewable energy power generation device and the connection line, $Y_{nn}$ is the negative-sequence admittance of the renewable energy power generation device and the connection line, $Y_{np}$ is the negative-sequence coupling admittance of the renewable energy power generation device and the connection line, $Y_{pn}$ is the positive-sequence coupling admittance of the renewable energy power generation device and the connection line, and $Z_{line}$ is impedance of the three-phase transmission lines between the renewable energy power generation device and the coupling transformers.

12. The method of claim 11, wherein the impedance of the three-phase transmission lines between the renewable energy power generation device and the coupling transformers is calculated by using a formula:

$$Z_{line} = \begin{bmatrix} j2\pi f_p L_{line} & 0 \\ 0 & j2\pi(f_p - 2f_1)L_{line} \end{bmatrix}$$

wherein $Z_{line}$ is the impedance of the three-phase transmission lines between the renewable energy power generation device and the coupling transformers, j is an imaginary part symbol, $f_p$ is a first preset frequency, $L_{line}$ is an inductance value of the three-phase transmission lines between the renewable energy power generation device and the coupling transformers, and $f_1$ is a rated frequency of the power grid.

13. A system for measuring broadband impedance of a renewable energy power generation device, wherein the renewable energy power generation device is connected to three-phase transmission lines of a power grid through primary sides of three coupling transformers in a measurement device respectively; one end of a secondary side of each of the three coupling transformers in the measurement device is connected to a respective output of a disturbance injection device in the measurement device, and another end of the secondary side of each of the three coupling transformers is connected to one another, and wherein the system for measuring broadband impedance of the renewable energy power generation device comprises: one or more memories storing one or more programs and one or more processors, wherein the one or more processors, when executing the one or more programs, are configured to:

inject a voltage disturbance into the renewable energy power generation device by using the disturbance injection device, and acquire three-phase voltage and three-phase current of each of preset measurement points;

calculate relevant variables before the renewable energy power generation device is decoupled from the measurement device and impedance of the power grid, according to the three-phase voltage and the three-phase current of each of the preset measurement points; and calculate impedance of the renewable energy power generation device after being decoupled from the measurement device and the impedance of the power grid, by using the relevant variables before the renewable energy power generation device is decoupled from the measurement device and the impedance of the power grid.

14. The system of claim 13, wherein a first inductor is arranged on each phase of the three-phase transmission lines between the renewable energy power generation device and a respective one of the coupling transformers, and a second inductor is arranged on each phase of the three-phase transmission lines between a respective one of the coupling transformers and the power grid, each of the preset measurement points is selected from a respective phase of the three-phase transmission lines between a respective one of the coupling transformers and the first inductor.

15. The system of claim 13, wherein in injecting the voltage disturbance into the renewable energy power generation device by using the disturbance injection device, and acquiring the three-phase voltage and the three-phase current of each of the preset measurement points, the one or more processors are configured to:

in a preset measurement period $T_m$, at each of preset operation points of the renewable energy power generation device, inject, by using the disturbance injection device, a positive-sequence voltage disturbance at each first preset frequency into the renewable energy power generation device, and acquire a first three-phase voltage and a first three-phase current of each of the preset measurement points, until a continuous injection time of the positive-sequence voltage disturbance reaches $T_d$, at which injection of the positive-sequence voltage disturbance is stopped; and in the preset measurement period $T_m$, at each of the preset operation points of the renewable energy power generation device, inject, by using the disturbance injection device, a negative-sequence voltage disturbance at each second preset frequency into the renewable energy power generation device, and acquire a second three-phase voltage and a second three-phase current of each of the preset measurement points, until a continuous injection time of the negative-sequence voltage disturbance reaches $T_d$, at which injection of the negative-sequence voltage disturbance is stopped, wherein $T_d < (T_m/2)$.

16. The system of claim 15, wherein the first preset frequency and the second preset frequency meet a formula:

$$f_{pp} = f_p - 2f_1$$

wherein $f_p$ is the first preset frequency, $f_{pp}$ is the second preset frequency, and $f_1$ is a rated frequency of the power grid.

17. The system of claim 13, wherein in calculating the relevant variables before the renewable energy power generation device is decoupled from the measurement device and the impedance of the power grid, according to the three-phase voltage and the three-phase current of each of the preset measurement points, the one or more processors are configured to perform Fourier transform on the three-phase voltage and the three-phase current of each of the preset measurement points, to obtain the frequency domain signals and in performing the Fourier transform on the three-phase voltage and the three-phase current of each of the preset measurement points, to obtain the frequency domain signals, the one or more processors are configured to:

perform Fourier transform on a first three-phase voltage of each of the preset measurement points at a first preset frequency, to obtain a first disturbance voltage positive-sequence frequency domain signal; perform Fourier transform on the first three-phase voltage of each of the preset measurement points at a second preset frequency, to obtain a first disturbance voltage negative-sequence frequency domain signal; perform Fourier transform on a first three-phase current of each of the preset measurement points at the first preset frequency, to obtain a first disturbance current positive-sequence frequency domain signal; and perform Fourier transform on the first three-phase current of each of the preset measurement points at the second preset frequency, to obtain a first disturbance current negative-sequence frequency domain signal; and perform Fourier transform on a second three-phase voltage of each of the preset measurement points at the first preset frequency, to obtain a second disturbance voltage positive-sequence frequency domain signal; perform Fourier transform on the second three-phase voltage of each of the preset measurement points at the second preset frequency, to obtain a second disturbance voltage negative-sequence frequency domain signal; perform Fourier transform on a second three-phase current of each of the preset measurement points at the first preset frequency, to obtain a second disturbance current positive-sequence frequency domain signal; and perform Fourier transform on the second three-phase current of each of the preset measurement points at the second preset frequency, to obtain a second disturbance current negative-sequence frequency domain signal.

18. The system of claim 13, wherein in calculating the impedance of the renewable energy power generation device after being decoupled from the measurement device and the impedance of the power grid, by using the relevant variables before the renewable energy power generation device is decoupled from the measurement device and the impedance of the power grid, the one or more processors are configured to:

calculate relevant variables after the renewable energy power generation device is decoupled from the measurement device and the impedance of the power grid, by using the relevant variables before the renewable energy power generation device is decoupled from the measurement device and the impedance of the power grid; and calculate the impedance of the renewable energy power generation device, by using the relevant variables after the renewable energy power generation device is decoupled from the measurement device and the impedance of the power grid.

19. The system of claim 18, wherein the relevant variables after the renewable energy power generation device is decoupled from the measurement device and the impedance of the power grid comprise:

a positive-sequence admittance of the renewable energy power generation device and a connection line, a negative-sequence admittance of the renewable energy power generation device and the connection line, a positive-sequence coupling admittance of the renewable energy power generation device and the connection line, and a negative-sequence coupling admittance of the renewable energy power generation device and the connection line.

20. A non-transitory computer-readable storage medium, having stored thereon a computer program, the computer program implementing a method for measuring broadband impedance of a renewable energy power generation device, when the computer program is executed, wherein the renewable energy power generation device is connected to three-phase transmission lines of a power grid through primary sides of three coupling transformers in a measurement device respectively; one end of a secondary side of each of the three coupling transformers in the measurement device is connected to a respective output of a disturbance injection device in the measurement device, and another end of the secondary side of each of the three coupling transformers is connected to one another, and wherein the method for measuring broadband impedance of the renewable energy power generation device comprises:

injecting a voltage disturbance into the renewable energy power generation device by using the disturbance injection device, and acquiring three-phase voltage and three-phase current of each of preset measurement points;

calculating relevant variables before the renewable energy power generation device is decoupled from the measurement device and impedance of the power grid, according to the three-phase voltage and the three-phase current of each of the preset measurement points; and calculating impedance of the renewable energy power generation device after being decoupled from the measurement device and the impedance of the power grid, by using the relevant variables before the renewable energy power generation device is decoupled from the measurement device and the impedance of the power grid, wherein calculating the relevant variables before the renewable energy power generation device is decoupled from the measurement device and the impedance of the power grid, according to the three-phase voltage and the three-phase current of each of the preset measurement points comprises:

performing Fourier transform on the three-phase voltage and the three-phase current of each of the preset measurement points, to obtain frequency domain signals; and calculating the relevant variables before the renewable energy power generation device is decoupled from the measurement device and the impedance of the power grid, by using the frequency domain signals, wherein the frequency domain signals comprise: a first disturbance voltage positive-sequence frequency domain signal, a first disturbance voltage negative-sequence frequency domain signal, a first disturbance current positive-sequence frequency domain signal, a first disturbance current negative-sequence frequency domain signal, a second disturbance voltage positive-sequence frequency domain signal, a second disturbance voltage negative-sequence frequency domain signal, a second disturbance current positive-sequence frequency domain signal, and a second disturbance current negative-sequence frequency domain signal, the relevant variables before the renewable energy power generation device is decoupled from the measurement device and the impedance of the power grid comprise: an equivalent negative-sequence admittance of coupling the measurement device to the power grid, an equivalent positive-sequence admittance of coupling the measurement device to the power grid, a positive-sequence admittance before the renewable energy power generation device is decoupled from the measurement device, a negative-sequence admittance before the renewable energy power generation device is decoupled from the measurement device, a ratio of a negative-sequence voltage to a positive-sequence voltage when a positive-sequence voltage disturbance is injected, and a ratio of a negative-sequence voltage to a positive-sequence voltage when a negative-sequence voltage disturbance is injected, and wherein the equivalent negative-sequence admittance of coupling the measurement device to the power grid is calculated by using a formula:

$$Y_{eq1} = -i_{n1}/v_{n1}$$

wherein $Y_{eq1}$ is the equivalent negative-sequence admittance of coupling the measurement device to the power grid, $i_{n1}$ is the first disturbance current negative-sequence frequency domain signal, and $v_{n1}$ is the first disturbance voltage negative-sequence frequency domain signal;

the equivalent positive-sequence admittance of coupling the measurement device to the power grid is calculated by using a formula:

$$Y_{eq2} = -i_{p2}/v_{p2}$$

wherein $Y_{eq2}$ is the equivalent positive-sequence admittance of coupling the measurement device to the power grid, $i_{p2}$ is the second disturbance current positive-sequence frequency domain signal, and $v_{p2}$ is the second disturbance voltage positive-sequence frequency domain signal;

the positive-sequence admittance before the renewable energy power generation device is decoupled from the measurement device is calculated by using a formula:

$$Y_p = i_{p1}/v_{p1}$$

wherein $Y_p$ is the positive-sequence admittance before the renewable energy power generation device is decoupled from the measurement device, $i_{p1}$ is the first disturbance current positive-sequence frequency domain signal, and $v_{p1}$ is the first disturbance voltage positive-sequence frequency domain signal;

the negative-sequence admittance before the renewable energy power generation device is decoupled from the measurement device is calculated by using a formula:

$$Y_n = i_{n2}/v_{n2}$$

wherein $Y_n$ is the negative-sequence admittance before the renewable energy power generation device is decoupled from the measurement device, $i_{n2}$ is the second disturbance current negative-sequence frequency domain signal, and $v_{n2}$ is the second disturbance voltage negative-sequence frequency domain signal;

the ratio of the negative-sequence voltage to the positive-sequence voltage when the positive-sequence voltage disturbance is injected is calculated by using a formula:

$$D_p = v_{n1}/v_{p1}$$

wherein $D_p$ is the ratio of the negative-sequence voltage to the positive-sequence voltage when the positive-sequence voltage disturbance is injected;

the ratio of the negative-sequence voltage to the positive-sequence voltage when the negative-sequence voltage disturbance is injected is calculated by using a formula:

$$D_n = v_{p2}/v_{n2}$$

wherein $D_n$ is the ratio of the negative-sequence voltage to the positive-sequence voltage when the negative-sequence voltage disturbance is injected.

\* \* \* \* \*